United States Patent
Kato et al.

(10) Patent No.: US 7,232,714 B2
(45) Date of Patent: Jun. 19, 2007

(54) SEMICONDUCTOR DEVICE

(75) Inventors: Kiyoshi Kato, Atsugi (JP); Tadafumi Ozaki, Atsugi (JP); Kohei Mutaguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 135 days.

(21) Appl. No.: 10/304,967

(22) Filed: Nov. 27, 2002

(65) Prior Publication Data

US 2003/0164522 A1 Sep. 4, 2003

(30) Foreign Application Priority Data

Nov. 30, 2001  (JP) ......................... 2001-367994

(51) Int. Cl.
*H01L 21/00* (2006.01)

(52) U.S. Cl. ..................... 438/166; 438/30; 438/487

(58) Field of Classification Search ............ 438/30, 438/149, 150, 151, 152, 155, 166, 308, 486, 438/487

See application file for complete search history.

(56) References Cited

U.S. PATENT DOCUMENTS

| | | | |
|---|---|---|---|
| 5,569,610 A | 10/1996 | Zhang et al. | |
| 5,569,936 A | 10/1996 | Zhang et al. | |
| 5,595,923 A | 1/1997 | Zhang et al. | |
| 5,614,426 A | 3/1997 | Funada et al. | |
| 5,614,733 A | 3/1997 | Zhang et al. | |
| 5,624,851 A | 4/1997 | Takayama et al. | |
| 5,643,826 A | 7/1997 | Ohtani et al. | |
| 5,677,549 A | 10/1997 | Takayama et al. | |
| 5,696,388 A | 12/1997 | Funada et al. | |
| 5,705,829 A | 1/1998 | Miyanaga et al. | |
| 5,756,364 A | 5/1998 | Tanaka et al. | |
| 5,783,468 A | 7/1998 | Zhang et al. | |
| 5,808,318 A | 9/1998 | Masumo et al. | |
| 5,858,269 A | * 1/1999 | Shinjo et al. ............... | 349/127 |
| 5,923,962 A | 7/1999 | Ohtani et al. | |
| 6,008,101 A | 12/1999 | Tanaka et al. | |
| 6,096,581 A | 8/2000 | Zhang et al. | |
| 6,285,042 B1 | 9/2001 | Ohtani et al. | |
| 6,335,541 B1 | 1/2002 | Ohtani et al. | |
| 6,358,759 B1 | * 3/2002 | Hirabayashi ............... | 438/7 |
| 6,548,867 B2 | 4/2003 | Yamada et al. | |
| 6,593,215 B2 | * 7/2003 | Hiraga et al. ............... | 438/486 |
| 6,624,445 B2 | 9/2003 | Miyanaga et al. | |

(Continued)

FOREIGN PATENT DOCUMENTS

| | | |
|---|---|---|
| JP | 07-183536 | 7/1995 |
| JP | 07-183540 | 7/1995 |
| JP | 10-065180 | 3/1998 |
| JP | 11-121753 | 4/1999 |
| JP | 2000-196101 | 7/2000 |
| JP | 2000-353810 | 12/2000 |
| JP | 2001-255560 | 9/2001 |

*Primary Examiner*—Kevin M. Picardat
(74) *Attorney, Agent, or Firm*—Eric J. Robinson; Robinson Intellectual Property Law Office, P.C.

(57) ABSTRACT

A semiconductor device having a display unit, which is small in size, suppresses the defect caused by the mounting of IC chips and the like on the substrate, and operates at a high speed. A semiconductor display unit and other circuit blocks are integrally formed on the substrate having an insulating surface by using a process for fabricating TFTs that realize a high degree of mobility. Concretely, there is employed a process for crystallizing a semiconductor active layer by using a continuously oscillating laser. Further, the process for crystallization relying upon the continuously oscillating laser is selectively effected for only those circuit blocks that must be operated at high speeds, thereby to realize a high production efficiency.

67 Claims, 22 Drawing Sheets

U.S. PATENT DOCUMENTS

| | | |
|---|---|---|
| 6,627,485 B2 * | 9/2003 | Murade ..................... 438/155 |
| 6,642,073 B1 | 11/2003 | Zhang et al. |
| 6,709,902 B2 * | 3/2004 | Kitakado et al. ........... 438/149 |
| 6,806,499 B2 | 10/2004 | Yamazaki et al. |
| 6,955,954 B2 | 10/2005 | Miyanaga et al. |
| 6,998,639 B2 | 2/2006 | Ohtani et al. |
| 7,126,161 B2 | 10/2006 | Yamazaki |
| 2005/0041166 A1 | 2/2005 | Yamazaki et al. |
| 2006/0068569 A1 | 3/2006 | Miyanaga et al. |

* cited by examiner

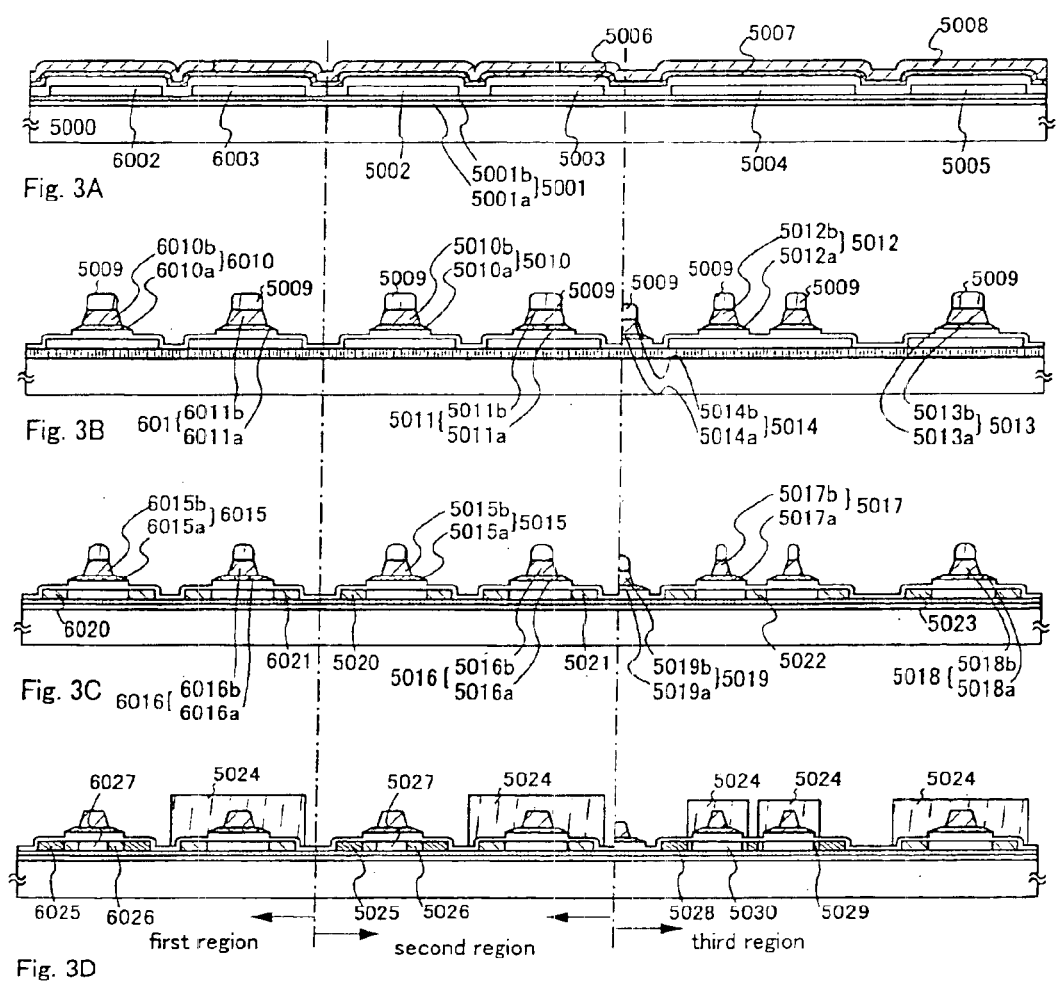

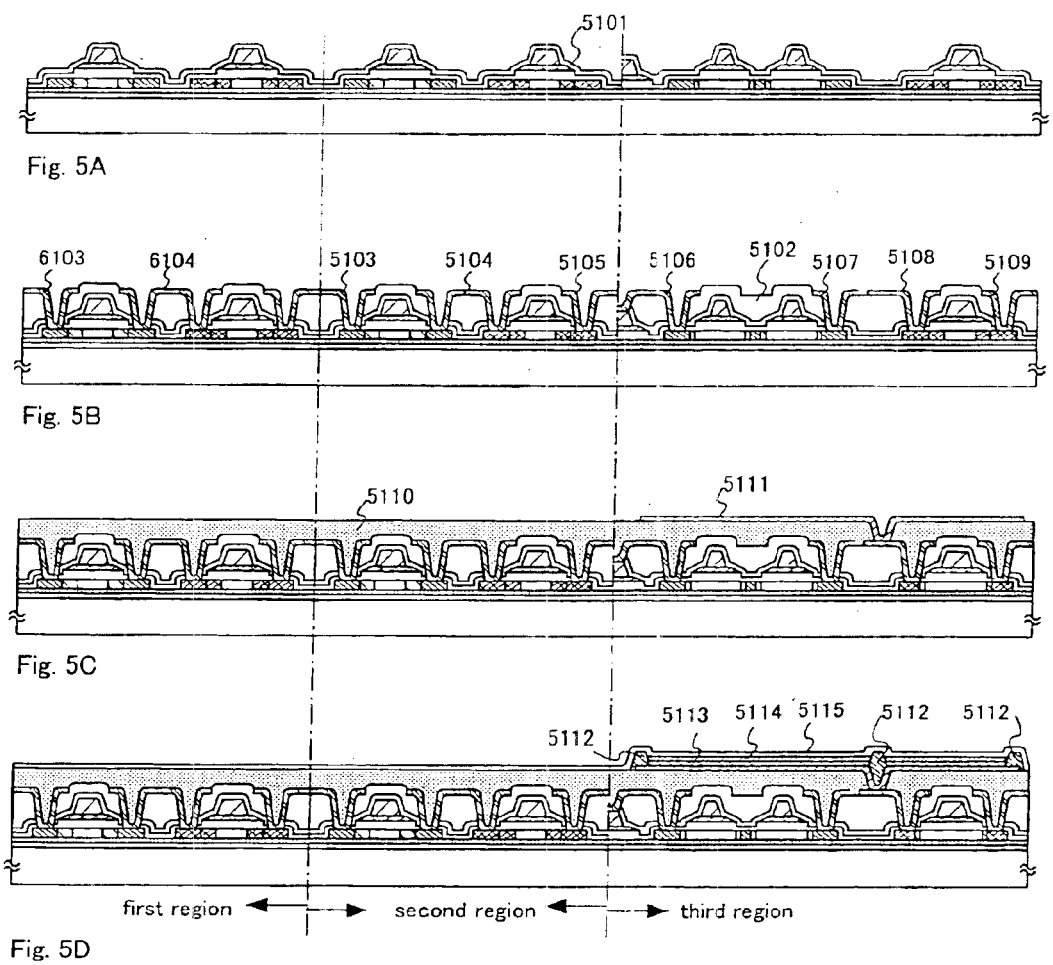

Relative scanning direction of laser light

SEMICONDUCTOR DEVICE

BACKGROUND OF THE INVENTION

1. Field of the Invention

The present invention relates to a semiconductor device having a display portion. In particular, the present invention relates to a semiconductor device in which thin film transistors are formed over a substrate having an insulation film surface thereon.

2. Related Art of the Invention

Semiconductor devices and, particularly, electronic devices having a semiconductor display unit have been vigorously developed in recent years, and their applications can be represented by such portable devices as game devices, notebook PCs, cellular phones as well as such diversities as liquid crystal TVs, liquid crystal displays, EL displays and so on. As compared to the traditional CRTs, the semiconductor display units can be realized in reduced weights, reduced thickness and consuming electric power in small amounts.

As the conventional semiconductor display units, there have been known a semiconductor display unit of the passive matrix type having a pixel region on which striped electrodes are formed in a manner to intersect each other on the upper and lower sides with the liquid crystal layer or light-emitting layer sandwiched therebetween, and a semiconductor display unit of the active matrix type having a pixel region on which thin-film transistors (TFTs) are arranged like a matrix.

In recent years, technology has advanced for forming TFTs over a substrate, and efforts have been made to apply the semiconductor display unit of the active matrix type. In particular, the TFTs using a polysilicon film exhibit an electric field effect mobility (often called simply as mobility) which is higher than that of the conventional TFTs using an amorphous silicon film, and are making it possible to control the pixels by a drive circuit formed over the same substrate as that of the pixels though the pixels have heretofore been controlled by a drive circuit outside the substrate.

Next, the constitution of an electronic device having a conventional semiconductor display unit will be described. FIG. 21 is a block diagram schematically illustrating portions related to the display of an image. In FIG. 21, a semiconductor device 301 receives or forms image data, processes the image data, converts the format, and displays the image. Examples of the semiconductor device 301 include game devices, video cameras, car navigation systems, personal computers and so on.

On the semiconductor device 301, a semiconductor display unit 302 is constituted by a pixel region 319, a scanning line drive circuit 318 and a signal line drive circuit 317, and is formed as a unitary structure on a substrate having an insulating surface. Other circuit blocks are formed on different silicon substrates and are mounted in the form of IC chips. Some of the circuit blocks may often be formed over the same silicon substrate.

The semiconductor device 301 is constituted by an input terminal 311, a first control circuit 312, a second control circuit 313, a CPU 314, a first memory 315, a second memory 316, and the semiconductor display unit 302. The input terminal 311 receives data that serve as the basis of image data depending upon the kind of the electronic devices. For example, the input data are those through an antenna in the case of a broadcast receiver, and the input data are those from a CCD in the case of a video camera. The input data may be those from a DV tape or a memory card. The data input through the input terminal 311 are converted into image signals through the first control circuit 312. The first control circuit 312 processes the image signals, such as decoding the image data that are compressed and encoded according to the MPEG standard and the tape format, and interpolating and resizing the image. The image signals output from the first control circuit 312 and the image signals formed or processed by the CPU 314, are fed to the second control circuit 313, and are converted into a format (e.g., scanning format, etc.) that is adapted to the semiconductor display unit 302. The second control circuit 313 produces image signals and control signals of which the formals have been converted.

The CPU 314 efficiently controls the signal processing in the first control circuit 312, second control circuit 313 and other interface circuits. The CPU 314 further forms and processes the image data. The first memory 315 is used as a memory region for storing image data from the first control circuit 312 and for storing image data from the second control circuit 313, as a work memory region for executing the control operation by using a CPU, and as a work memory region at the time of forming the image data by the CPU. As the first memory 315, there can be used a DRAM or an SRAM. The second memory 316 stores the color data and character data, and is necessary when the image data are to be formed or processed by the CPU 314. The second memory 316 is constituted by a mask ROM or an EPROM.

The semiconductor display unit 302 is constituted by the signal line drive circuit 317, scanning line drive circuit 318 and pixel region 319. The signal line drive circuit 317 receives image signals and control signals from the second control circuit 313 (clock signals, start pulse signals and the like), and the scanning line drive circuit 318 receives control signals (clock signals, start pulse signals and the like) from the second control circuit 313. The pixel region 319 displays the image.

The electronic device having the semiconductor display unit can assume a variety of constitutions in addition to the constitution shown in FIG. 21. The simplest constitution may comprise the semiconductor display unit, input/output terminals and a simple control circuit as exemplified by a liquid crystal display or an EL display. When the CPU bears a too large load in the architecture shown in FIG. 21, an image processor may be newly provided to reduce the burden of the CPU.

In the conventional electronic device having the semiconductor display unit described above, the circuit blocks other than the drive circuit are mounted being formed over a substrate separate from the substrate over which the pixels are formed.

Accompanying the widespread use of portable electronic devices, it is becoming an important assignment to realize the electronic devices in small sizes. The thus constituted semiconductor devices, however, require many IC chips that are mounted over the substrates separate from the substrate over which the pixels are formed, and involve difficulty if they are to be realized in small sizes. In particular, even if the circuit blocks are realized in small sizes in the IC chip, a large margin required for the mounting makes it difficult to fabricate the entire device in a small size. If it is attempted to decrease the margin for the mounting to realize the device in a small size, then, a high degree of mounting technology is needed arousing a problem from the standpoint of cost and reliability in the mounting portion. There further remains the problem of wiring capacity. That is, when the IC chips are mounted, the wiring must bear a large load making it difficult to conduct the operation at high speeds.

As a method of solving these problems, it has been expected to form the circuit blocks integrally with the semiconductor display unit.

When the circuit blocks are formed over the substrate having an insulating surface, however, a problem often arouses concerning the operation speed. This is because, the TFTs formed over the substrate such as a glass surface having an insulating surface exhibit properties such as mobility and threshold values which are inferior to those of the transistors formed over a single crystalline silicon substrate.

When the conventional semiconductor devices are operated at a given frequency, therefore, a desired operation is realized when the circuit blocks are mounted in the form of IC chips but the desired operation is not realized when the circuit blocks are formed over the substrate having the insulating surface.

SUMMARY OF THE INVENTION

This invention was accomplished in view of such problems. It is an assignment of this invention to provide an electronic device having a semiconductor display unit which can be realized in a small size, which decreases defects that accompanies the mounting of IC chips over the substrate and which operates at high speeds.

In order to solve the above assignment according to this invention, the semiconductor display unit and other circuit blocks are integrally formed over the substrate having an insulating surface.

Further, a TFT fabrication process for realizing a high degree of mobility is employed in order to lessen the problem of operation speed when the circuit blocks are formed over the substrate having an insulating surface.

According to the TFT fabrication process for realizing a high degree of mobility, a semiconductor film is irradiated with an energy beam to form a molten band which is continuously scanned in the channel direction to crystallize the molten band so as to form an active layer. Concretely speaking, this process is carried out by using a continuous wave laser although the details will be described later in Examples.

The circuit blocks constituted by the thus fabricated TFTs make it possible to greatly increase the operation frequency since the individual TFTs exhibit a high degree of mobility as compared to that of the circuit blocks that use the conventional polysilicon as the TFT activating layer.

As a result, it is allowed to integrally form the display unit and other circuit blocks over the substrate having the insulating surface thereby to realize a high-speed operation. Namely, this invention now makes it possible to put into practical use even those circuit blocks which, so far, could not be placed in practice despite they were formed over the substrate having the insulating surface due to the problem related to the operation speed.

Besides, this invention improves the throughput in a manner as described below while maintaining such a high operation frequency.

A $YVO_4$ laser, a YLF laser and a YAG laser have been known as continuous wave lasers. However, their outputs are as small as about 10 watts even at the greatest. To crystallize the active layer by the irradiation with a continuous wave laser beam, therefore, the laser beam must be sharply focused to have a beam width of about 50 to about 500 μm (typically 200 μm).

When, for example, the whole surface of a glass substrate measuring 600 mm×720 mm is scanned with a laser beam at a scanning speed of 50 cm/sec, a time of 72 minutes is required per a piece. In practice, further, longer time is needed due to shifting of the scanning direction of the laser beam and acceleration. Namely, the technology encounters the problem of a low throughput.

This invention has a feature in that the crystallization process based on the continuous wave laser is selectively carried out for only the circuit blocks that need a high-speed operation. This greatly improves the throughput of the crystallization process by using the continuously oscillating laser.

By suppressing the region irradiated with the continuous wave laser beam to be, for example, not larger than 50% (preferably, not larger than 30%) of the substrate area, the time required for the crystallization process by using the continuous wave laser can be decreased down to about 50% (preferably, not longer than 30%).

It is further desired to arrange the circuit blocks that need high-speed operation in the regions as close to each other as possible in order to suppress the moving distance of the continuously oscillating laser beam or of the substrate. This further helps improve the throughput of the crystallization process by using the continuous wave laser.

In order to further improve the operation frequency of the circuit block, it is desired to bring the direction of channel length of the TFTs into agreement with the scanning direction of the laser beam. This is because, in the process for crystallizing the semiconductor film by using the continuous wave laser, the highest degree of mobility is obtained when the channel direction of the TFTs is nearly in parallel (desirably, from −30° to 30°) with the scanning direction of the laser beam for the substrate. The TFTs formed by the crystallizing process by using the continuous wave laser comprises active layers formed by a polycrystalline semiconductor in which crystalline grains extends in the channel direction. This means that crystalline grain boundaries are formed along the channel direction. Therefore, the electric character of the active layers is different between the channel direction and the direction perpendicular to the channel direction. In a word, the active layers crystallized by using the continuous wave laser has an electric anisotropy in the channel direction.

The semiconductor active layer included in the circuit block or in the pixel region which needs not be crystallized by the continuous wave laser, may be formed by a known method of formation.

In particular, it is desired to apply a crystallization process that offers a higher throughput than that of the crystallization process that uses the continuous wave laser.

It is particularly desired to employ a method of crystallizing the semiconductor film (thermal crystallization by using a metal catalyst) disclosed in Japanese Patent Laid-Open No. 7-183540. In this case, in the region where the semiconductor film is crystallized by the continuous wave laser, a process is carried out by combining the thermal crystallization using a metal catalyst with the crystallization using a continuous wave laser. Here, as demonstrated in Examples, the above process forms the TFTs having a mobility equal to, or greater than, that in the crystallization conducted by using the continuous wave laser only.

A method of crystallization by laser by using a pulse oscillation laser may be employed for the semiconductor active layer in the region where the crystallization based on the continuous wave laser is not carried out. The pulse oscillation laser produces a large output, being capable of emitting a beam of a width of not smaller than 100 mm, and offers a high throughput. From the standpoint of operation frequency and cost, the person who carries out the process may employ known methods of forming the active layer in free combination. The TFTs formed by a known manufacturing method are different from the TFTs formed by the crystallization process by using the continuous wave laser. Specifically, the shape of crystal grains in active layers of the TFTs formed by a known method have no anisotropy in the channel direction, or have an anisotropy in the channel direction which is weaker than that of the TFTs formed by the crystallization process by using the continuous wave laser. In addition, the active layers of the TFTs formed by a known method have no electric anisotropy in the channel direction, or have an electric anisotropy in a channel direction which is weaker than that of the TFTs formed by the crystallization process by using the continuous wave laser.

In this invention as described above, the pixel region and the circuit blocks are formed over the same substrate, the process for crystallization by using the continuous wave laser is selectively effected for only those circuit blocks that need a high-speed operation, to provide a semiconductor device which lowers the occurrence of defect that stems from a reduction in the size and from the mounting of IC chips over the substrate, and which realizes a high-frequency operation and a high throughput. The high-speed operation can be realized even from the standpoint of wiring capacity.

The semiconductor device referred to in this invention stands for devices that work by utilizing the semiconductor characteristics, in general, such as semiconductor display devices as represented by a liquid crystal display device and a light-emitting device, and electronic devices having a semiconductor display unit. The semiconductor display unit stands for the one obtained by forming electrodes or thin-film transistors over a substrate having an insulating surface, such as a liquid crystal display unit, a light-emitting display unit, a display unit of the passive matrix type and a display unit of the active matrix type. When it is apparent, the semiconductor display unit is also simply referred to as display unit.

Further, the circuit block referred to in this invention stands for a block of an electric circuit exhibiting functions of characteristics constituted by such circuit elements as transistors, capacitor elements or resistor elements, and includes a signal line drive circuit, a scanning line drive circuit, a register, a decoder, a counter, a frequency-divider circuit, a memory, a CPU, and a DSP. In this specification, in particular, the circuit block is formed over the substrate having an insulating surface and, hence, the thin-film transistors (hereinafter referred to as TFTs) play the role of principal constituent elements in the circuit blocks. Here, the thin-film transistors (TFTs) stand for the transistors as a whole that are formed by using the SOI technology.

The configuration of the present invention is shown as below.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by irradiating a semiconductor film with an energy beam to form a molten band and by continuously scanning the molten band in the direction of channel length so as to be crystallized, and the second active layer being formed by crystallizing the semiconductor film by the treatment with heat, wherein: the pixel region is constituted by the second TFTs; the scanning line drive circuit is constituted by the second TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by irradiating a semiconductor film with an energy beam to form a molten band and by continuously scanning the molten band in the direction of channel length so as to be crystallized, and the second active layer being formed by adding a metal element to the semiconductor film and crystallizing the semiconductor film by the treatment with heat, wherein: the pixel region is constituted by the second TFTs; the scanning line drive circuit is constituted by the second TFTs; and the signal line drive circuit is constituted by the first TFTs.

The foregoing energy beam may be a continuously oscillating laser beam.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by irradiating a semiconductor film with an energy beam to form a molten band and by continuously scanning the molten band in the direction of channel length so as to be crystallized, and the second active layer being formed by irradiating the semiconductor film with a pulse-like energy beam so as to be crystallized, wherein: the pixel region is constituted by the second TFTs; the scanning line drive circuit is constituted by the second TFTs; and the signal line drive circuit is constituted by the first TFTs.

The foregoing energy beam comprises pulses of an oscillating laser beam.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor in which the crystalline grains are extending in the channel direction, and the second active layer being formed by a polycrystalline semiconductor in which the polycrystalline grains have no shape anisotropy in the channel direction, wherein: the pixel region is constituted by the second TFTs; the scanning line drive circuit is constituted by the second TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor in which the crystalline grains are extending in the channel direction, and the second active layer being formed by a polycrystalline semiconductor in which the polycrystalline grains have a shape anisotropy in the channel direction which is weaker than that of the first active layer, wherein: the pixel region is constituted by the second TFTs; the scanning line drive circuit is constituted by the second TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor having an electric anisotropy in the channel direction, and the second active layer being formed by a polycrystalline semiconductor without having electric anisotropy in the channel direction, wherein: the pixel region is constituted by the second TFTs; the scanning line drive circuit is constituted by the second TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor having an electric anisotropy in the channel direction, and the second active layer being formed by a polycrystalline semiconductor having an electric anisotropy in the channel direction which is weaker than that of the first active layer, wherein: the pixel region is constituted by the second TFTs; the scanning line drive circuit is constituted by the second TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor in which the crystalline grains are extending in the channel direction and have a grain size of from 0.5 to 100 μm in the direction of short diameter thereof and a particle size of from 3 to 10,000 μm in the direction of long diameter thereof, and the second active layer being formed by a polycrystalline semiconductor in which the crystalline grains have a grain size of from 0.01 μm to 10 μm, wherein: the pixel region is constituted by the second TFTs; the scanning line drive circuit is constituted by the second TFTs; and the signal line drive circuit is constituted by the first TFTs.

It is preferable that the drive frequency of the scanning line drive circuit is from 1 kHz to 1 MHz, and the drive frequency of the signal line drive circuit is from 100 kHz to 100 MHz.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by irradiating a semiconductor film with an energy beam to form a molten band and by continuously scanning the molten band in the direction of channel length so as to be crystallized, and the second active layer being formed by treating the semiconductor film with heat so as to be crystallized, wherein: the pixel region is constituted by the second TFTs; the scanning line drive circuit is constituted by the first TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by irradiating a semiconductor film with an energy beam to form a molten band and by continuously scanning the molten band in the direction of channel length so as to be crystallized, and the second active layer being formed by adding a metal element to the semiconductor film and crystallizing the semiconductor film by the treatment with heat, wherein: the pixel region is constituted by the second TFTs; the scanning line drive circuit is constituted by the first TFTs; and the signal line drive circuit is constituted by the first TFTs.

The energy beam may be a continuous wave laser-beam.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by irradiating a semiconductor film with an energy beam to form a molten band and by continuously scanning the molten band in the direction of channel length so as to be crystallized, and the second active layer being formed by irradiating the semiconductor film with a pulse-like energy beam so as to be crystallized, wherein: the pixel region is constituted by the second TFTs; the scanning line drive circuit is constituted by the first TFTs; and the signal line drive circuit is constituted by the first TFTs.

The energy beam comprises pulses of an oscillating laser beam.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor in which the crystalline grains are extending in the channel direction, and the second active layer being formed by a polycrystalline semiconductor in which the polycrystalline grains have no anisotropy in the channel direction, wherein: the pixel region is constituted by the second TFTs; the scanning line drive circuit is constituted by the first TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor in which the crystalline grains are extending in the channel direction, and the second active layer being formed by a polycrystalline semiconductor in which the polycrystalline grains have a shape anisotropy in the channel direction which is weaker than that of the first active layer, wherein: the pixel region is constituted by the second TFTs; the scanning line drive circuit is constituted by the first TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor having an electric anisotropy in the channel direction, and the second active layer being formed by a polycrystalline semiconductor without having electric anisotropy in the channel direction, wherein: the pixel region is constituted by the second TFTs; the scanning line drive circuit is constituted by the first TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor having an electric anisotropy in the channel direction, and the second active layer being formed by a polycrystalline semiconductor having an electric anisotropy in the channel direction weaker than that of the first active layer, wherein: the pixel region is constituted by the second TFTs; the scanning line drive circuit is constituted by the first TFTs; and the signal line drive circuit is constituted by the first TFTs.

In accordance with the invention, a semiconductor device is offered, in which a pixel region, a scanning line drive circuit and a signal line drive circuit are provided over the same substrate, and has first TFTs with a first active layer and second TFTs with a second active layer, the first active layer being formed by a polycrystalline semiconductor in which the crystalline particles are extending in the channel direction and have a grain size of from 0.5 to 100 µm in the direction of short diameter thereof and a particle size of from 3 to 10,000 µm in the direction of long diameter thereof, and the second active layer being formed by a polycrystalline semiconductor in which the crystalline grains have a particle size of from 0.01 µm to 10 µm, wherein: the pixel region is constituted by the second TFTs; the scanning line drive circuit is constituted by the first TFTs; and the signal line drive circuit is constituted by the first TFTs.

It is desired that the drive frequency of the scanning line drive circuit is from 10 kHz to 1 MHz, and the drive frequency of the signal line drive circuit is from 100 kHz to 100 MHz.

In the semiconductor device, the memory may be provided over the same substrate as that of the pixel regions, the memory being constituted by the first TFTs.

The memory may be an SRAM having a read cycle time of not longer than 200 nsec.

The memory is a DRAM having a read cycle time of not longer than 1 µsec.

The CPU may be provided over the same substrate as that of the pixel regions, the CPU being constituted by the first TFTs.

It is preferred that the operation frequency of the CPU is not lower than 5 MHz.

The image processing circuit may be provided over the same substrate as that of the pixel regions, the image processing circuit being constituted by the first TFTs.

It is preferred that the operation frequency of the image processing circuit is not lower than 5 MHz.

The DSP is provided over the same substrate as that of the pixel regions, the DSP being constituted by the first TFTs.

It is preferred that the operation frequency of the image processing circuit is not lower than 5 MHz.

The timing generating circuit is provided over the same substrate as that of the pixel regions, the timing generating circuit being constituted by the first TFTs.

It is preferred that the substrate is any one of a plastic substrate, a glass substrate and a quartz substrate.

It is preferred that the area of the circuits constituted by the first TFTs is not larger than 50% of the area of the substrate.

It is preferred that the circuits constituted by the first TFTs are formed in 1 to 10 rectangular regions, the areas of the rectangular regions not being larger than 50% of the area of the substrate.

The semiconductor device may be a liquid crystal display device.

The semiconductor device may be a light-emitting device.

The semiconductor device may be any one selected from a game device, a video camera, a head-mounted type display, a DVD player, a personal computer, a cell phone and a car audio device.

BRIEF DESCRIPTION OF THE DRAWINGS

FIGS. 3A–3D are sectional views illustrating the steps of manufacturing TFTs for constituting the semiconductor device of this invention;

FIGS. 5A–5D are sectional views illustrating the steps of manufacturing TFTs for constituting the semiconductor device of this invention;

DETAILED DESCRIPTION OF THE INVENTION

Embodiment 1

A semiconductor display device of the active matrix type will now be described as a representative example of the semiconductor device having a display unit of the invention.

Figure 2:
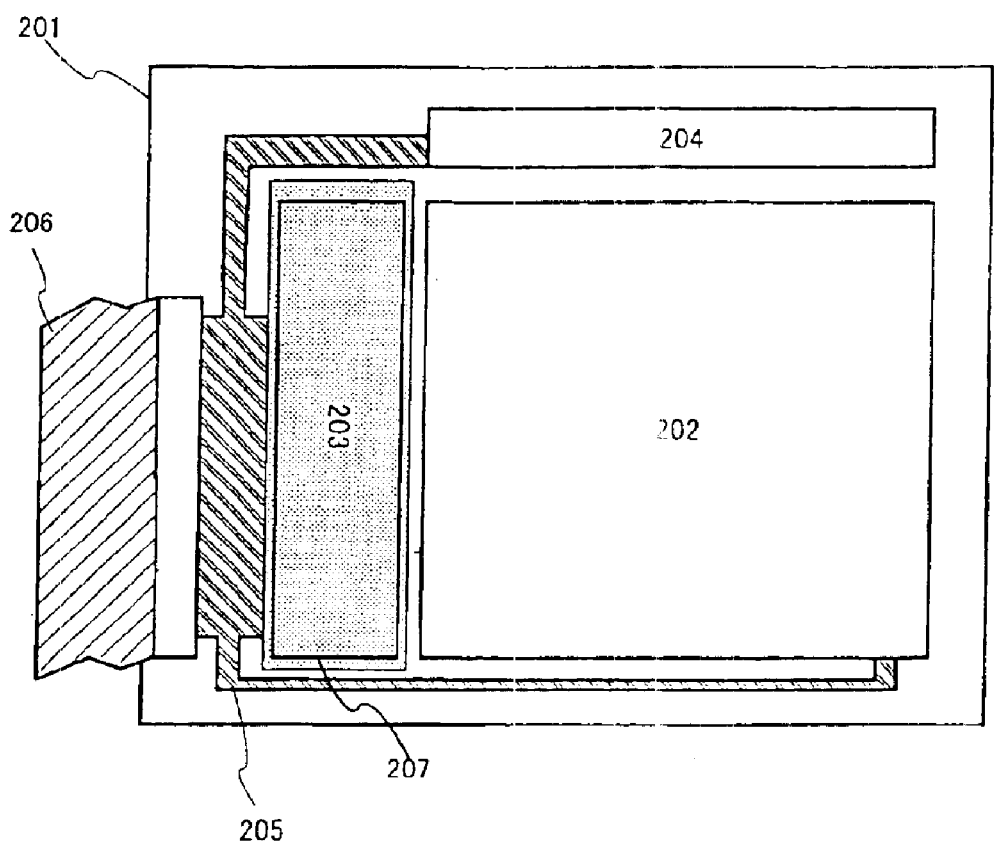
FIG. 2 is a view of the semiconductor device of this invention viewed from the top.

FIG. 2 is a view illustrating the constitution of the semiconductor display device of the active matrix type of the invention viewed from the top. In FIG. 2, the semiconductor display device of the active matrix type is constituted by a pixel region 202, a scanning line drive circuit 204, a signal line drive circuit 203, a wiring 205, and an FPC 206 formed over a substrate 201.

The operation of the semiconductor display device of the active matrix type will now be briefly described.

The signal line drive circuit 203 receives image signals, clock signals and a start pulse, and the scanning line drive circuit 204 receives clock signals and a start pulse, from an external unit through the FPC 206, respectively. The pixel region 202 displays an image.

In the pixel region, a plurality of signal lines and a plurality of scanning lines are so arranged as to intersect one another, and the pixel TFTs are arranged at the points where the signal lines intersect the scanning lines. A scanning line is connected to the gate electrode of the pixel TFT, a signal line is connected to either the source electrode or the drain electrode, and a liquid crystal element is connected to the remaining one of either the source electrode or the drain electrode.

The display operation of the pixel will now be described. When the scanning line is selected, the pixel TFT connected to the selected scanning line is turned on. When a data is input to the signal line connected to the pixel TFT, a potential of the signal line is applied to a liquid crystal element, and the liquid crystal element changes its light transmission factor depending upon an applied voltage. Thus, the luminance of the pixel is determined to make a display.

An image is formed as the scanning lines are all selected successively. While the scanning lines are being selected, further, the data is input to all of the signal lines successively or at one time, and the image data is input to a selected row. A period in which one image is displayed is called one frame. It is desired that not less than 60 frames are displayed in a second.

According to the above operation method, a driving frequency necessary for a driving circuit is roughly determined if the number of pixels is determined. Under the color VGA standard, for example, the number of pixels is 640× 480×RGB. If the operation is presumed to be 60 frames/ second, a period for selecting one scanning line is about Tg=1/601480 sec=35 μsec. Further, if receiving the image data is presumed to be RGB×1 pixel per a clock, then, each clock must be roughly Td=Tg/640 sec=54 nsec. The time for inputting the data to the pixel becomes roughly a period (Tg=35 μsec) for selecting one scanning line when the lines are successively driven.

The real operation frequency varies depending upon the number of dividing the image data, frame frequency, and fly-back period. It is required that the pixel and scanning line drive circuits operate at a frequency of 1 to 100 kHz, and the signal line drive circuit operates at a frequency of 0.1 to 100 MHz.

In the foregoing was described the case of the liquid crystal display device. The display devices having a light-emitting layer as represented by the EL layer share a common system in that an image is formed as the scanning lines are all selected successively and that the data is input successively or at one time to all of the signal lines during a period in which the scanning lines are being selected, and the image data is input to the selected raw, though the driving methods may differ to some extent. Therefore, the same idea can be applied to the driving frequency, too.

Based upon the above consideration of operation frequency, the embodiment 1 deals with a case where a process for fabricating high-mobility TFTs is applied to the region that includes the signal line drive circuit 203 that must be operated at a high speed. Namely, in FIG. 2, a method of crystallizing the semiconductor film by the continuously oscillating laser is applied to the first region 207 only. A known technology for forming the active layer may be used for the regions other than the first region.

In FIG. 2, the first region 207 can be reduced to be not larger than 30% (preferably, not larger than 10%) of the substrate 201, and the time required for the continuously oscillating laser process can be shortened to be roughly not more than 30% (preferably, not more than 10%) of the time required for processing by using the continuously oscillating laser with respect to the whole substraate.

In the embodiment 1, a process for fabricating high mobility TFTs is employed for the first region 207 that includes the signal line drive circuit which determines the speed, to realize a semiconductor display device of the active matrix type achieving a high-speed operation as a whole. Further, a high throughput is realized despite of using a crystallization process using the continuously oscillating laser.

Though the embodiment 1 has applied the process for fabricating high-mobility TFTs to the region including the signal line drive circuit, the above process can be further applied to the region that includes the scanning line drive circuit or may be applied to the region that includes pixels. In particular, even when the process for fabricating high-mobility TFTs is applied to the region that includes all of TFTs, the throughput increases as compared to a case that the process is applied to the whole substrate.

Embodiment 2

A semiconductor device having a display unit will now be described as a representative example of the semiconductor device having the display unit of the invention.

Figure 1:
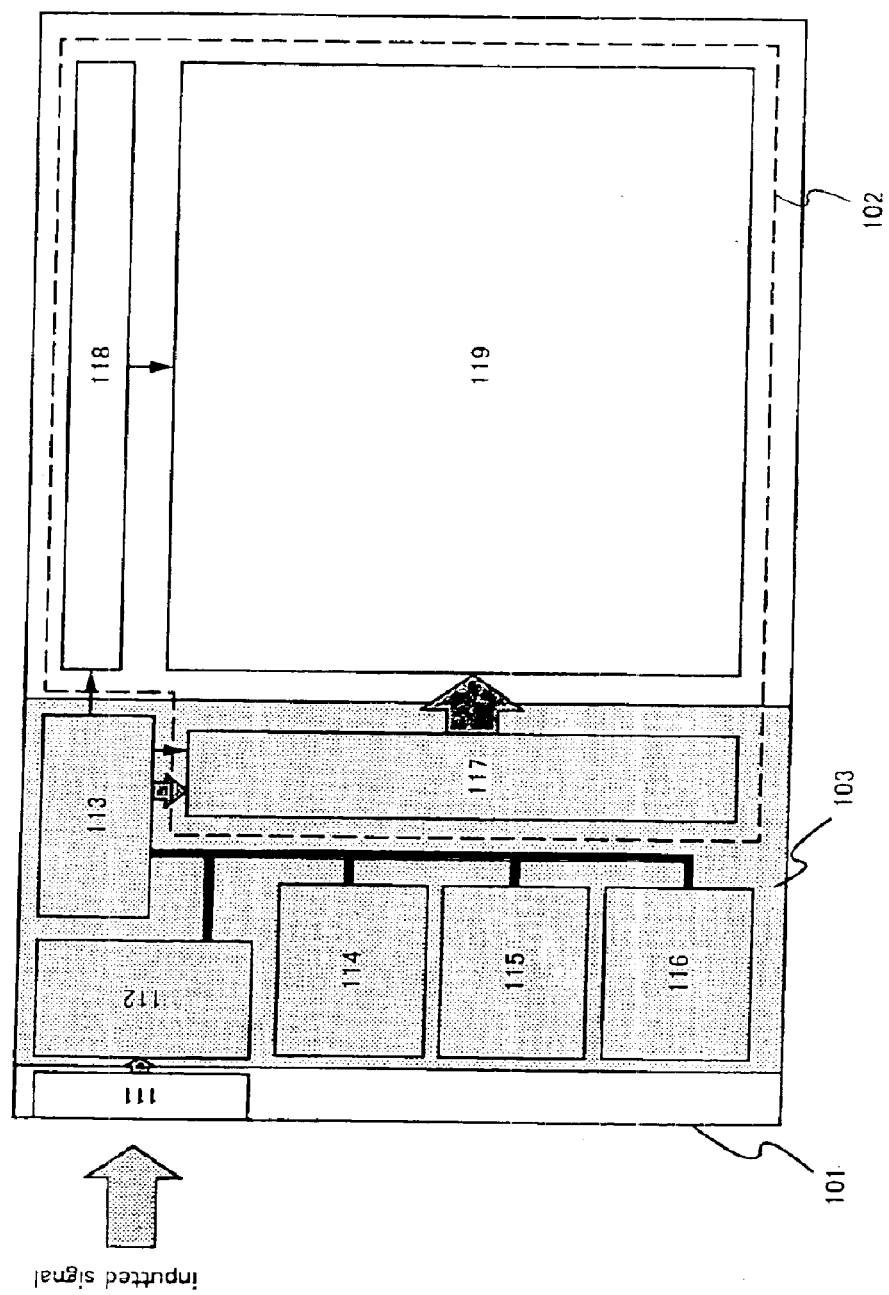
FIG. 1 is a view of a semiconductor device of this invention viewed from the top.

FIG. 1 is a view illustrating the constitution of the semiconductor device having the display unit of the invention viewed from the top. In FIG. 1, the semiconductor device having the display unit is constituted by a semiconductor display unit 102, a first control circuit 112, a second control circuit 113, a CPU 114, a first memory 115, a second memory 116, and an input/output terminal 111 formed over a substrate 101. Further, the semiconductor display unit 102 is constituted by a pixel region 119, a signal line drive circuit 117 and a scanning line drive circuit 118.

Figure 21:
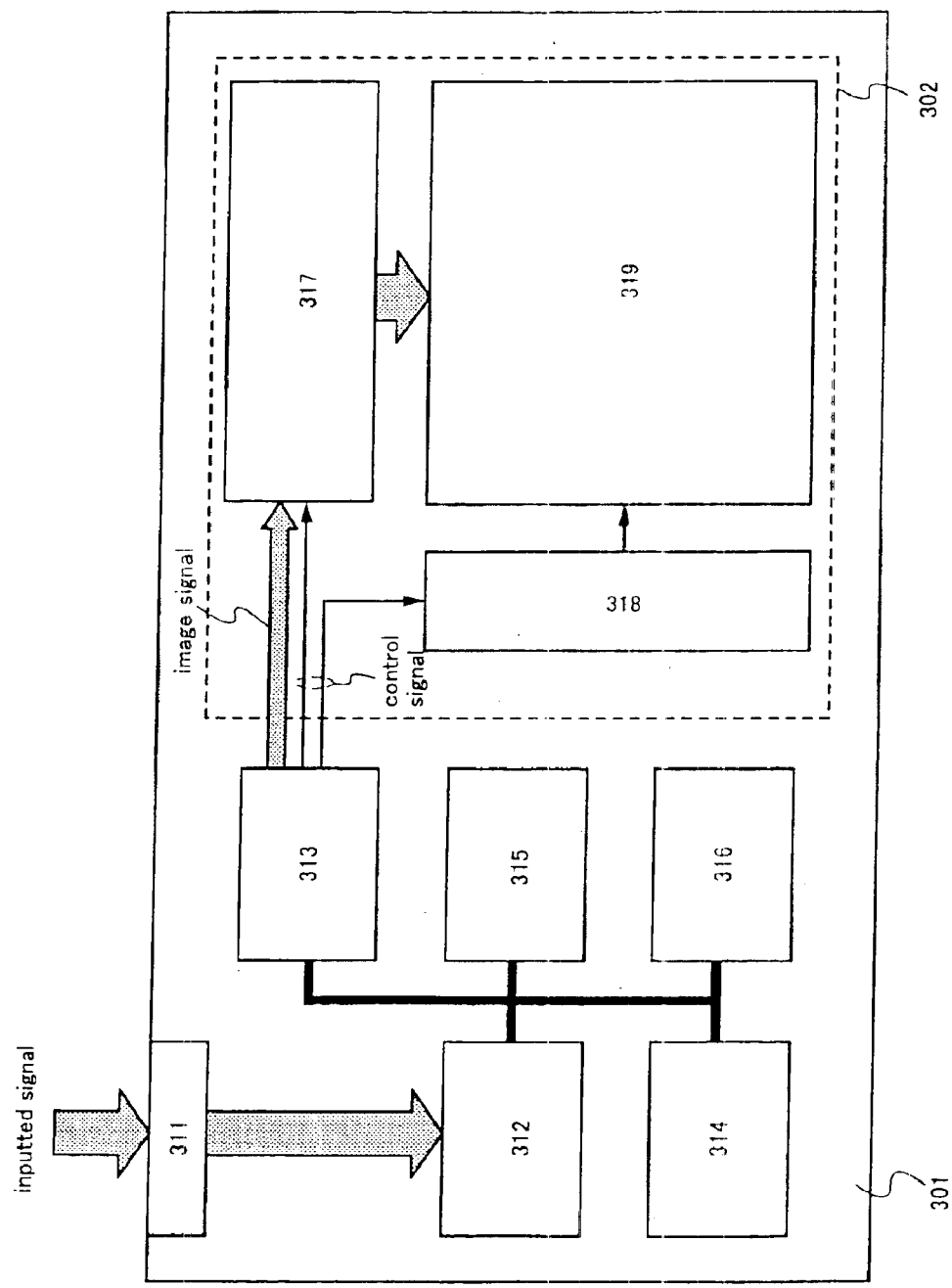
FIG. 21 is a block diagram illustrating a conventional semiconductor device.
Figure 22:
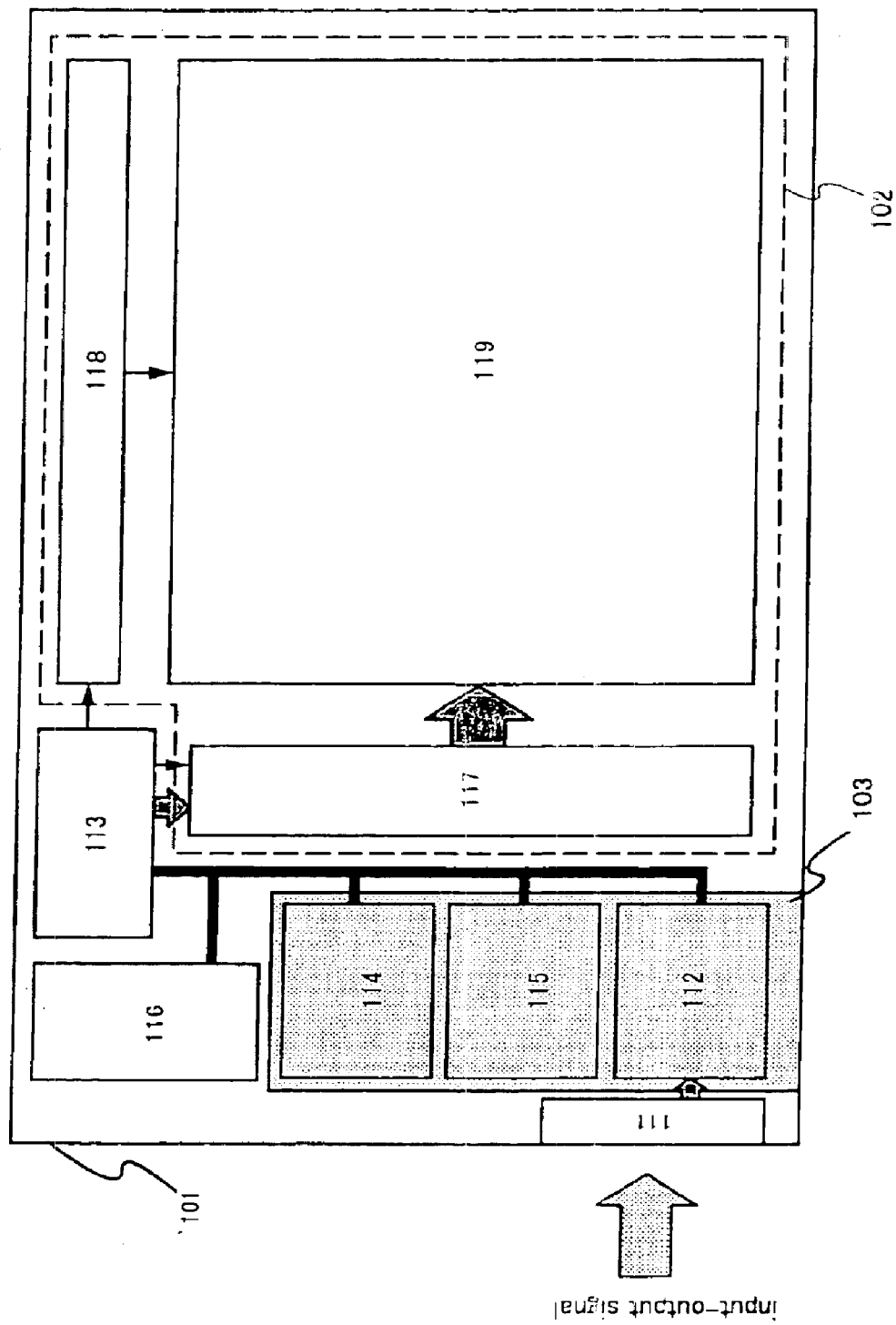
FIG. 22 is a view of a semiconductor device of this invention viewed from the top.

The semiconductor device shown in FIG. 1 receives or forms image data, processes the image data, converts the format and displays the image. The block constitution is the same as that of the block diagram of FIG. 21. The operation and function are as illustrated in FIG. 21, and are not described here.

The operation frequencies of the circuit blocks vary depending upon the individual semiconductor devices, and cannot be definitely stated. Usually, however, other circuit blocks operate in synchronism with the operation frequency of the CPU. It is therefore desired to improve the operation frequencies of the CPU 114 and the circuit blocks connected to the bus.

In the embodiment 2, therefore, the process for fabricating high-mobility TFTs is applied to the CPU 114, the first control circuit 112, the second control circuit 113, the first memory 115 and the second memory 116 that are connected to the bus, as well as to the signal line drive circuit 117. Namely, in FIG. 1, the method of crystallizing the semiconductor active layer based on the continuous wave laser is applied only to the first region 103. A known technology for forming the active layer may be used for the regions other than the first region.

In FIG. 1, the first region 103 can be reduced to be not larger than 50% (preferably, not larger than 30%) of the substrate, and the time required for the process with the continuous wave laser can be shortened to be not more than about 50% (preferably, not more than 30%) of the time required for processing with the continuous wave laser with respect to the whole substrate.

It is further desired that the region where the semiconductor active layer is crystallized by using the continuous-wave laser is concentratedly located as much as possible from the standpoint of throughput. In the constitution shown in FIG. 1, it is possible to replace the positions of the signal line drive circuit and the scanning line drive circuit by each other. By arranging the signal line drive circuit that must be operated at a high speed near the CPU 114 and the first control circuit 112, second control circuit 113, first memory 115 and second memory 116 that are connected to the bus, the first region is concentratedly located on the substrate.

Owing to this arrangement, the position of irradiation with the continuous wave laser beam needs not be moved to the whole surface of the substrate, and the time required for the crystallization can be shortened as compared to the case that the continuous wave laser is irradiated onto a plurality of regions having the same area scattered over the substrate.

It is thus desired that the areas for being irradiated with the continuous wave laser beam are concentratedly located on the substrate. It is therefore desired that the continuous wave laser or the substrate moves in a simple manner and that the regions for being irradiated with the continuous wave laser beam are reduced to several (preferably, one to ten) regions as represented by rectangles.

In the embodiment 2, the semiconductor device for accomplishing a high-speed operation of the device as a whole is realized by using the process for fabricating high-mobility TFTs in the first region 103 which includes a system having the CPU 114 that must be operated at high speeds. By reducing the ratio of the first region to the substrate, further, a high throughput is realized despite of using the process for crystallization based on the continuous wave laser.

In the embodiment 2, the process for fabricating the high-mobility TFTs is applied to the region that includes the CPU 114, first control circuit 112, second control circuit 113, first memory 115, second memory 116 and signal line drive circuit 117. Even when operated at the same frequency, however, characteristics required for the TFTs differ depending upon the constitutions of the circuit blocks.

For example, when particularly high degree of characteristics are required for the TFTs that constitute the CPU 114, first control circuit 112 and first memory 115, the process for fabricating high-mobility TFTs can be applied to only regions that include the above circuits.

In such a case, too, it is desired to contrive the arrangement of the CPU 114, first control circuit 112 and first memory 115 so that the active layer is crystallized with the continuous wave laser in a short period of time.

It is allowable to apply the process for fabricating high-mobility TFTs to the region that includes the scanning line drive circuit or the region that includes pixels, in addition to the first region, as a matter of course. Even when the process for fabricating high-mobility TFTs is applied to all of the regions that include the TFTs, the throughput is improved as compared to the case where the process for fabricating high-mobility TFTs is applied to the whole substrate.

In this embodiment, although the circuit blocks have been roughly divided like the CPU and the memory, the invention is not limited thereto. Smaller circuit constitutions such as a register, a frequency divider circuit, may be used as circuit blocks. The process for crystallization based on the continuous wave laser may be selectively applied to such small blocks.

When the crystallization process using a continuous wave laser is applied to large circuit blocks such as the CPU and the memory, the process needs not necessarily be applied to the entire surfaces thereof. The process can further be selectively applied to only regions of relatively high operation frequencies in the circuit blocks.

Working examples of the invention will now be described.

EXAMPLE 1

Figure 20:
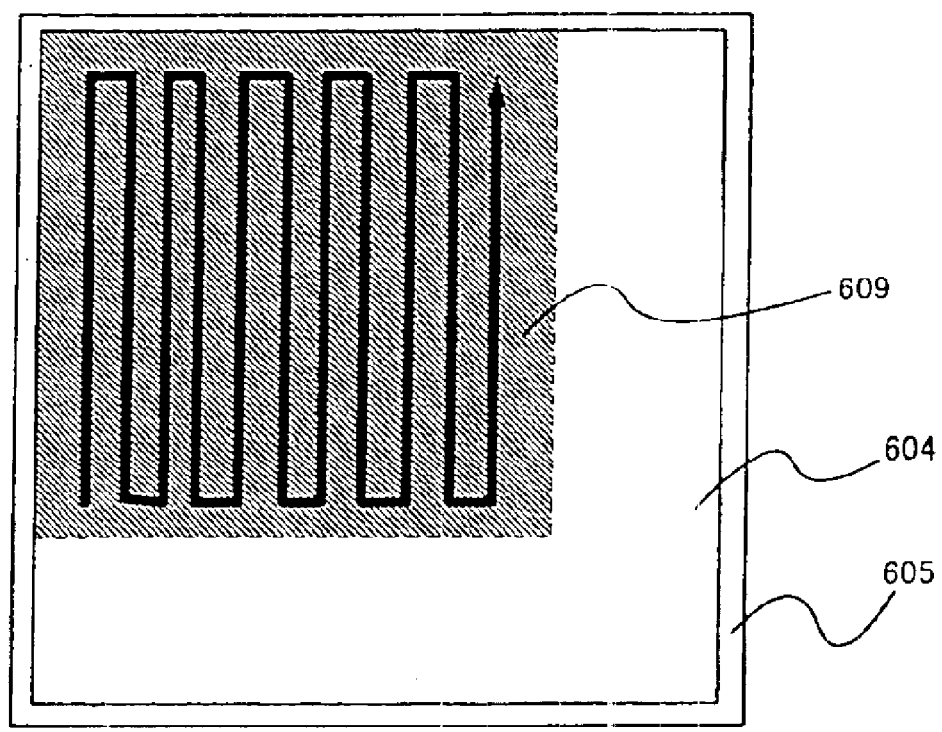
FIG. 20 is a view illustrating a method of irradiating a laser beam.

In this example, a method for performing a laser beam irradiation to any region over the substrate is described with reference to FIGS. 6 and 20.

Figure 6:
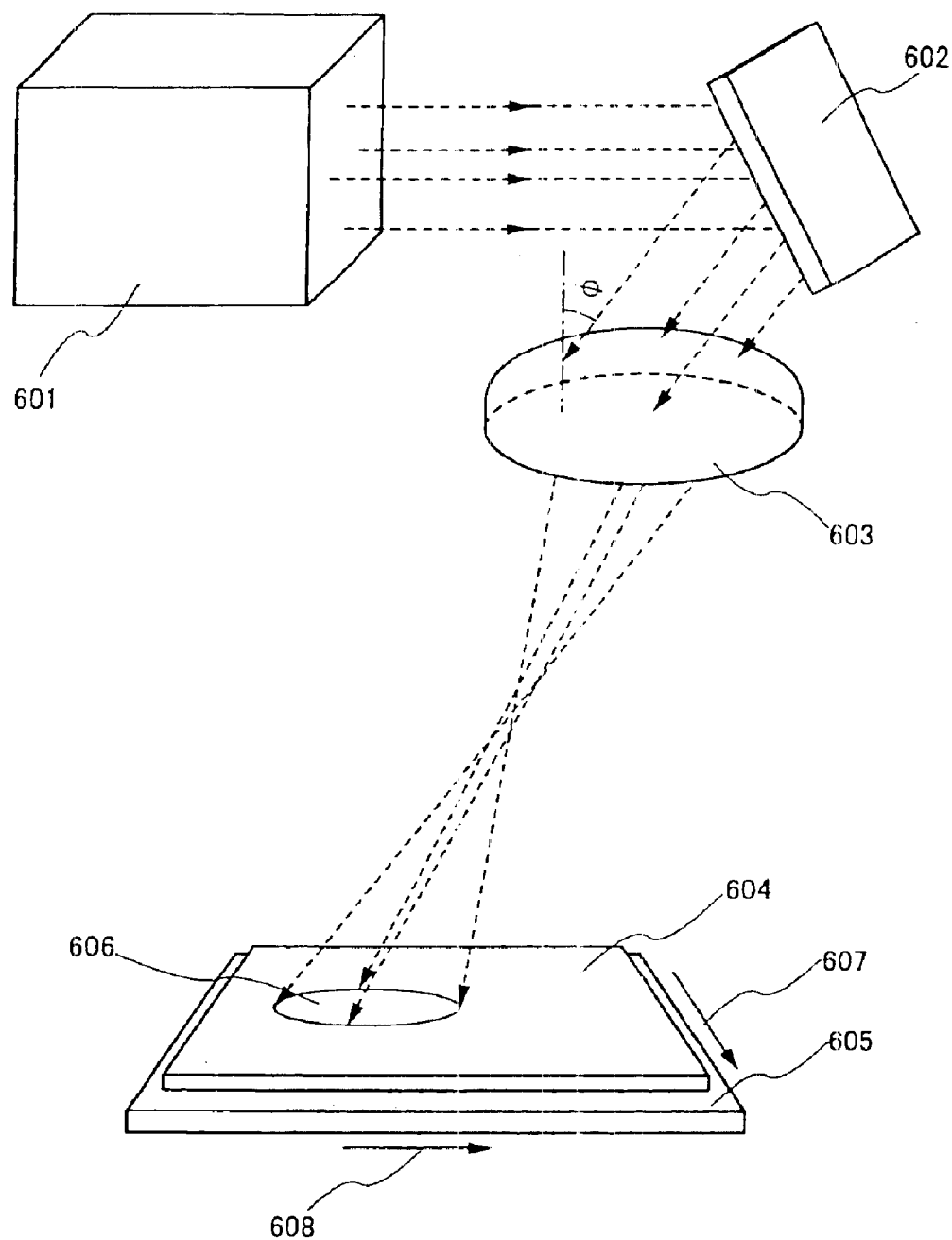
FIG. 6 is a view schematically illustrating an optical system used for irradiating a laser beam.

FIG. 6 shows a view schematically illustrating a device used for forming a linear beam and irradiating a laser beam to a substrate.

A laser beam emitted from a laser 601 is incident into a convex lens 603 via a mirror 602. Here, as the laser 601, anyone of a solid state laser, a gas laser and a metal laser of continuous oscillation or pulse oscillation may be used. However, used in this example is YAG laser of continuous wave. Then, a laser oscillated from the laser 601 may be converted into a higher harmonic wave by a non-linear optical element. Moreover, a beam expander between the laser 601 and the mirror 602 or between the mirror 602 and the convex lens 603 is set and may be expanded into the desired size in both of longer direction and shorter direction, respectively. The beam expander is particularly effective in the case where the shape of the laser beam emitted from the laser is small. Moreover, the mirror may not be set, or a plurality of the mirrors may be set.

The laser beam is made slantly incident with respect to the convex lens 603. The focal position is shifted with aberration such as astigmatism by being incident in such a way, a linear beam 606 can be formed on the irradiation surface or in its neighborhood. It should be noted that if the convex lens 603 is made of a synthetic quartz glass, it is desired since a high transparency is obtained. Moreover, as for the convex lens, it is desirable that an aspherical lens whose spherical lens aberration is corrected is used. If an aspherical lens is used, the condensing property is enhanced, and the aspect ratio and the distribution of the energy density are also enhanced.

In addition, the "linear shape" described here means not a "line" in the strict sense but a rectangle (or a prolate ellipsoid shape) having a high aspect ratio. For example, it indicates a shape having an aspect ratio of 2 or more (preferably, 10 to 10000). Note that the linear shape is used to obtain an energy density required for sufficiently annealing an object to be irradiated. In addition, the linear beam has no necessity to be a linear shape in the strict sense.

Then, while the linear beam 606 formed thus irradiates, for example, it can irradiate the desired region or whole area on the irradiated body 604 by being relatively moved with respect to the irradiated body 604, for example, in the direction indicated with the reference numeral 607 or the directions indicated with the reference numeral 608. "To be relatively moved" is concretely referred to "to operate the irradiated body disposed on the stage".

Then, while the linear beam formed thus irradiates, for example, it can irradiate the desired region or whole area on the irradiated body 604 by being relatively moved with respect to the irradiated body 604, for example, in the direction indicated with the reference numeral 607 or the directions indicated with the reference numeral 608. "To be relatively moved" is concretely referred to "to operate the irradiated body disposed on the stage". The state of irradiating the laser beam to the substrate is shown in FIG. 20. An arrow illustrated over a laser irradiation region 609 illustrates the track of the irradiating laser.

In addition, the optical system for generating laser may be other known ones.

EXAMPLE 2

In this example, a method for crystallizing a semiconductor film by using a continuous wave laser used to a process for manufacturing a TFT with high mobility in a semiconductor device of the invention is described.

As a base film, a silicon oxynitride film (composition ratio: Si=32%, O=59%, N=7%, and H=2%) in 400 nm thick is formed over a glass substrate by plasma CVD method. Then, as a semiconductor film, 150 nm of amorphous silicon film is formed on the base film by plasma CVD method. Then, thermal processing at 500° C. is performed thereon for three hours so that hydrogen contained in the semiconductor film is discharged. After that, the semiconductor film is crystallized by laser annealing method.

As the laser used for laser annealing method, continuous wave $YVO_4$ laser is used. For the laser annealing method, the second harmonic (wavelength 532 nm) of the $YVO_4$ laser is used as laser light. As the beam in a predetermined form, laser light is irradiated to the semiconductor film formed on the substrate surface by using an optical system.

As an optical system used when laser light is irradiated to a semiconductor film over a substrate surface, used is an optical system described in Example 1 (refer to FIG. 6).

In Example 2, the elliptical beam of 200 μm×50 μm is formed having incident angle φ of about 20° of laser light with respect to the convex lens. The elliptical beam is irradiated on the glass substrate 105 by being moved at the speed of 50 cm/s. Thus, the semiconductor film is crystallized.

The relative scanning direction of the elliptical beam is perpendicular to the major axis of the elliptical beam.

Figure 7:
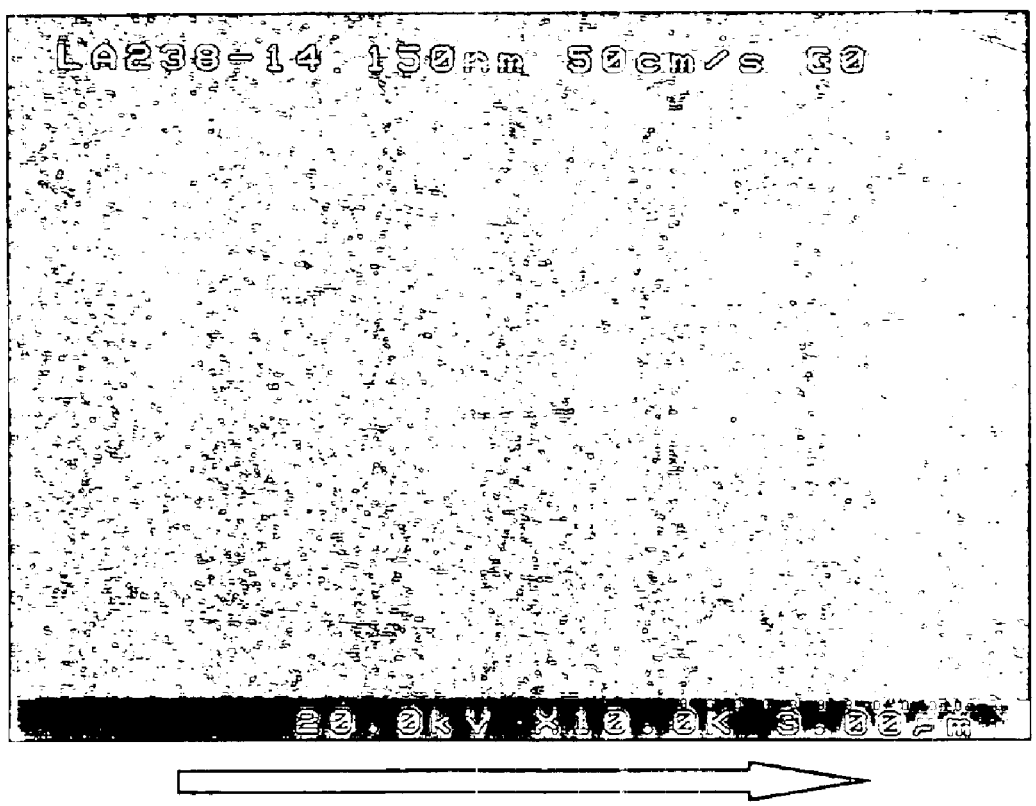
FIG. 7 is a photograph of a SEM image on the surface of a crystalline semiconductor film.

The seco etching is performed on the crystalline semiconductor film obtained in this way. FIG. 7 shows the result of the observation of the surface by using an SEM with 10,000 magnifications. The seco solution used for the seco etching is manufactured by adding $K_2Cr_2O_7$ as additive to $HF:H_2O=2:1$. One shown in FIG. 7 is obtained by relatively scanning laser light in a direction indicated by an arrow shown in FIG. 7. Large crystal grains are formed in parallel with the scanning direction of the laser light. In other words, the crystal is raised so as to extend in the scanning direction of the laser light.

In this way, large crystal grains are formed on the crystallized semiconductor film by using the method according to this example. Therefore, when the semiconductor film is used as a semiconductor active layer to manufacture a TFT, the number of the crystal grain boundaries included in the channel forming area of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, when the TFT is positioned such that the direction that the carrier moves can be the same as the direction that the formed crystal grains extend, the number of times that the carriers cross the crystal grain boundary can be extremely reduced. Therefore, a variation in ON current value (value of drain current flowing when the TFTs is ON), an OFF current value (value of drain current flowing when the TFT is OFF), a threshold voltage, an S-value and field effect mobility can be reduced. As a result, the electric characteristic can be improved significantly.

In order to irradiate the elliptical beam 606 in a wide range of the semiconductor film, the elliptical beam 606 is scanned in a direction perpendicular to the major axis to irradiate to the semiconductor film multiple times. Here, the position of the elliptical beam 606 is shifted in the direction parallel to the major axis for every single scan. The scanning direction becomes opposite between serial scans. In the serial two scans, one will be called outward scan and the other will be called inward scan hereinafter.

The amount of shifting the position of the elliptical beam 606 to the direction parallel to the major axis for every single scan is expressed by pitch d. A reference numeral D1 indicates, in the outward scan, the length of the elliptical beam 606 in the direction perpendicular to the scanning direction of the elliptical beam 606 in an area having large crystal grains as shown in FIG. 7. A reference numeral D2 indicates, in the inward scan, the length of the elliptical beam 606 in the direction perpendicular to the scanning direction of the elliptical beam 606 in an area having large crystal grains as shown in FIG. 11. In this case, an average value of D1 and D2 is D.

Here, an overlap ratio $R_{OL}$ [%] is defined by Equation 1.

$$R_{OL}=(1-d/D)\times 100 \qquad [\text{EQ1}]$$

In this example, the overlap ratio $R_{OL}$ is 0%

EXAMPLE 3

Example 3 shows another example of a method for crystallizing a semiconductor film by using a continuous wave laser used to a process for manufacturing a TFT with high mobility in a semiconductor device of the present invention that is different from Example 2.

The steps up to forming an amorphous silicon film as a semiconductor film are the same as those of the Example 2. After that, the method disclosed in Japanese Patent Application Laid-open No. 7-183540 is used. Nickel acetate solution (5 ppm in weight conversion concentration and 10 ml in volume) is coated on the semiconductor film by spin coating method. Then, thermal processing is performed thereon in a nitrogen atmosphere at 500° C. for one hour and in a nitrogen atmosphere at 550° C. for twelve hours. Then, the crystallinity of the semiconductor film is improved by laser annealing method.

As the laser used for laser annealing method, continuous wave $YVO_4$ laser is used. For the laser annealing method, the second harmonic (wavelength 532 nm) of the $YVO_4$ laser is used as laser light. The elliptical beam of 200 μm×50 μm is formed having incident angle φ of about 20° of laser light with respect to the convex lens 103 in the optical system shown in FIG. 6. The elliptical beam is moved and irradiated to the glass substrate 105 at the speed of 50 cm/s. Thus, the crystallinity of the semiconductor film is improved.

The relative scanning direction of the elliptical beam 606 is perpendicular to the major axis of the elliptical beam 606.

Figure 8:
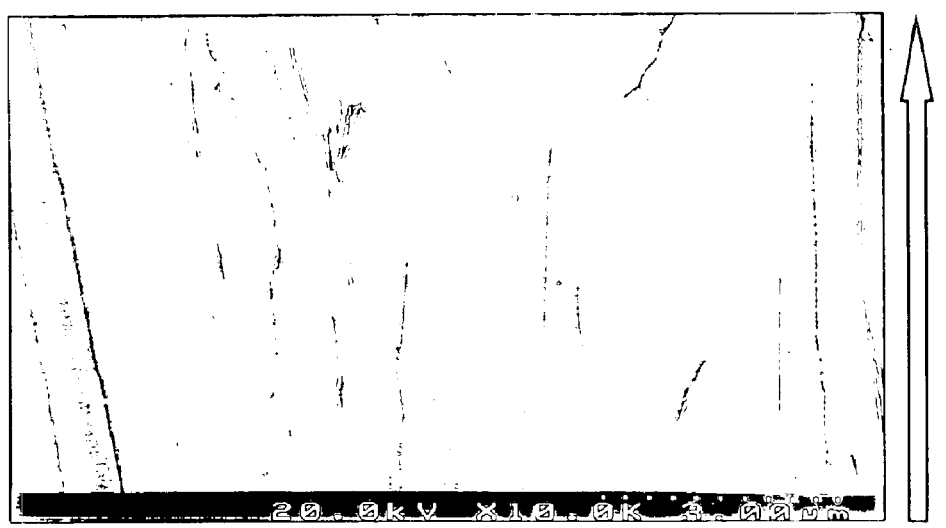
FIG. 8 is a photograph of a SEM image on the surface of a crystalline semiconductor film.

The seco etching is performed on the crystalline semiconductor film obtained in this way. FIG. 8 shows the result of the observation of the surface by using an SEM with 10,000 magnifications. One shown in FIG. 8 is obtained by relatively scanning laser light in a direction indicated by an arrow shown in FIG. 8. Large crystal grains extend in the scanning direction.

In this way, large crystal grains are formed in the crystallized semiconductor film according to the present invention. Therefore, when the semiconductor film is used to manufacture a TFT, the number of the crystal grain boundaries included in the channel forming region of the TFT can be reduced. In addition, each crystal grain internally has crystallinity, which is essentially single crystal. Therefore, the mobility (field effect mobility) as high as that of a transistor using a single crystal semiconductor can be obtained.

Furthermore, the formed crystal grains are aligned in one direction. Thus, when the TFT is positioned such that the direction that the carriers move can be the same as the direction that the formed crystal grains extend, the number of times that the carriers cross the crystal grain boundary can be extremely reduced. Therefore, a variation in ON current value, an OFF current value, a threshold voltage, an S-value and field effect mobility can be reduced. As a result, the electric characteristic can be improved significantly.

In order to irradiate the elliptical beam 606 in a wide range of the semiconductor film, the elliptical beam 606 is scanned in a direction perpendicular to the major axis to irradiate to the semiconductor film multiple times (this operation may be called scan). Here, the position of the elliptical beam 606 is shifted in the direction parallel to the major axis for every single scan. The scanning direction becomes opposite between continuous scans. In the continuous two scans, one will be called outward scan and the other will be called inward scan hereinafter.

The amount of shifting the position of the elliptical beam 606 to the direction parallel to the major axis for every single scan is expressed by pitch d. A reference numeral D1 indicates, in the outward scan, the length of the elliptical beam 606 in the direction perpendicular to the scanning direction of the elliptical beam 606 in an area having large crystal grains as shown in FIG. 8. A reference numeral D2 indicates, in the inward scan, the length of the elliptical beam 606 in the direction perpendicular to the scanning direction of the elliptical beam 606 in an area having large crystal grains as shown in FIG. 8. In this case, an average value of D1 and D2 is D.

Here, an overlap ratio $R_{O.L}$ [%] is defined like Equation 1. In this example, the overlap ratio $R_{O.L}$ is 0%.

Figure 9:
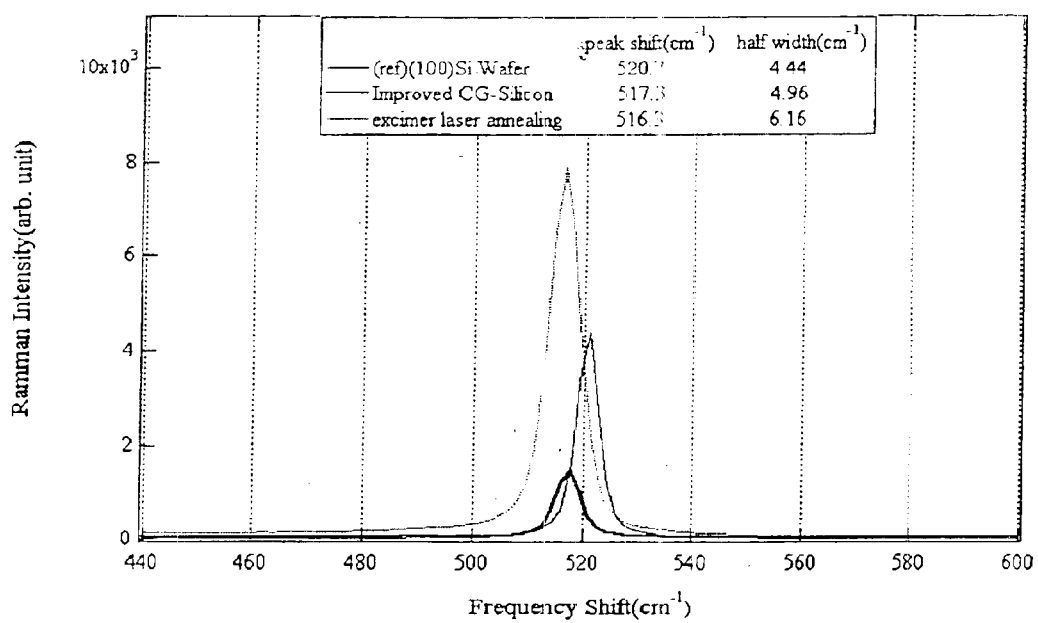
FIG. 9 is a diagram of Raman scattering spectra of semiconductor films.

In FIG. 9, a thick line indicates a result of Raman spectroscopy performed on the crystalline semiconductor film (represented by Improved CG-Silicon in FIG. 9) obtained by using the above-described crystallization method. Here, for comparison, a thin line indicates a result of Raman spectroscopy performed on the single crystal silicon (represented by ref. (100) Si Wafer in FIG. 9). In FIG. 9, a dotted line indicates a result of Raman spectroscopy performed on a semiconductor film (represented by excimer laser annealing in FIG. 9). In order to obtain the semiconductor film, an amorphous silicon film is formed and hydrogen contained in the semiconductor film is discharged through thermal processing. Then, the semiconductor film is crystallized by using excimer laser with pulse oscillation.

The Raman shift of the semiconductor film obtained by using the method of this example has the peak at 517.3 $cm^{-1}$. The half value breadth is 4.96 $cm^{-1}$. On the other hand, the Raman shift of the single crystal silicon has the peak at 520.7 $cm^{-1}$. The half value breadth is 4.44 $cm^{-1}$. The Raman shift of the semiconductor film crystallized by using the excimer laser with the pulse oscillation has the peak at 516.3 $cm^{-1}$. The half value breadth is 6.16 $cm^{-1}$.

From the results in FIG. 9, the crystallinity of the semiconductor film obtained by using the crystallization method described in this example is closer to that of the single crystal silicon than the crystallinity of the semiconductor film crystallized by using the excimer laser with pulse oscillation.

EXAMPLE 4

In this example, a case where a semiconductor film crystallized by using the method described in the Example 2 is used to manufacture a TFT will be described with reference to FIGS. 6, 10 and 11.

Figure 10A:
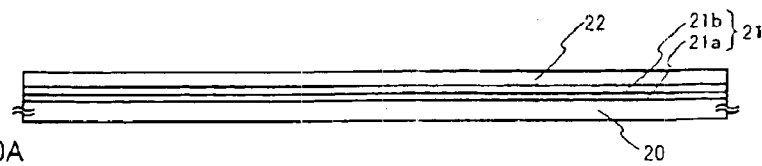
FIGS. 10A–10H are sectional views illustrating the steps of manufacturing TFTs.

A glass substrate is used as a substrate 20 in this example. As a base film 21, 50 nm of silicon oxynitride film (composition ratio Si=32%, O=27%, N=24%, and H=17%) and 100 nm of silicon oxynitride film (composition ratio Si=32%, O=59%, N=7%, and H=2%) are stacked on the glass substrate by plasma CVD method. Next, as a semiconductor film 22, 150 nm of amorphous silicon film is formed on the base film 21 by plasma CVD method. Then, thermal processing is performed thereon at 500° C. for three hours to discharge hydrogen contained in the semiconductor film (FIG. 10A).

Figure 10B:
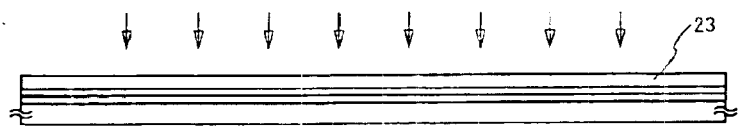

After that, the second harmonic (wavelength 532 nm, 5.5 W) of the continuous oscillating $YVO_4$ laser is used as the laser light to form an elliptical beam of 200 μm×50 μm having incident angle φ of about 20° of laser light with respect to the convex lens 603 in the optical system shown in FIG. 6. The elliptical beam is irradiated on the semiconductor film 202 by relatively being scanned at the speed of 50 cm/s (FIG. 10B).

Figure 10C:

Then, first doping processing is performed thereon. This is channel doping for controlling the threshold value. $B_2H_6$ is used as material gas having a gas flow amount of 30 sccm, a current density of 0.05 μA, an accelerating voltage of 60 keV, and a dosage of $1\times10^{14}/cm^2$ (FIG. 10C).

Figure 10D:
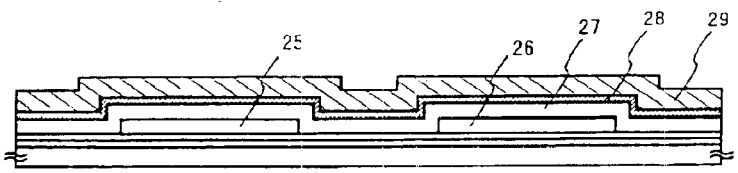

Next, after etching the semiconductor film 24 into a desired form by patterning, a silicon oxynitride film in 115 nm thick is formed by plasma CVD method as a gate insulating film 27 covering the etched semiconductor film. Then, a TaN film 28 in 30 nm thick and a W film 29 in 370 nm thick are stacked on the gate insulating film 27 as a conductive film (FIG. 10D).

A mask (not shown) made of resist is formed thereon by using photolithography method, and the W film, the TaN film and the gate insulating film are etched.

Figure 10E:
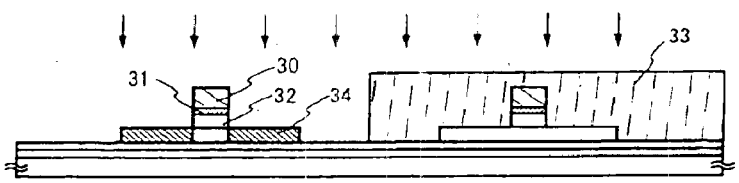

Then, the mask made of resist is removed, and a new mask 33 is formed. The second doping processing is performed thereon and an impurity element imparting the n-type to the semiconductor film is introduced. In this case, the conductive layers 30 and 31 are masks for the impurity element imparting the n-type, and an impurity region 34 is formed in a self-aligned manner. In this example, the second doping processing is performed under two conditions because the semiconductor film is thick as much as 150 nm. In this example, phosfin ($PH_3$) is used as material gas. The dosage of $2\times10^{13}/cm^2$ and the accelerating voltage of 90 keV are used, and then the dosage of $5\times10^{14}/cm^2$ and the accelerating voltage of 10 keV are used for the processing (FIG. 10E).

Figure 10F:
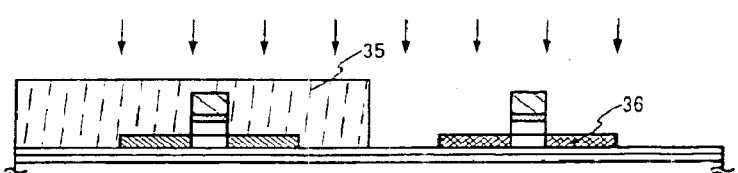

Next, the mask 33 made of resist is removed, and a new mask 35 made of resist is formed additionally for performing the third doping processing. Through the third doping processing, an impurity region 36 is formed containing an impurity element for imparting the opposite conductive type against the one conductive type to the semiconductor film which is an active layer of a p-channel TFT. By using the conductive layers 30 and 31 as a mask for the impurity element, the impurity region 36 is formed in the self-aligned manner by addition of the impurity element for imparting the p-type. Also the third doping processing in this example is performed under two conditions because the semiconductor film is thick as much as 150 nm. In this example, diborane ($B_2H_6$) is used as material gas. The dosage of $2\times10^{13}/cm^2$ and the accelerating voltage of 90 keV are used, and then the dose amount of $1\times10^{15}/cm^2$ and the accelerating voltage of 10 keV are used for the processing (FIG. 10F).

Through these steps, the impurity regions 34 and 36 are formed in the respective semiconductor layers.

Next, the mask 35 made of resist is -removed, and silicon oxynitride film (composition ratio Si=32.8%, O=63.7%, and N=3.5%) in 50 nm thick is formed as a first interlayer insulating film 37 by plasma CVD method.

Figure 10G:

Next, thermal processing is performed thereon to recover crystallinity of the semiconductor layers and to activate the impurity elements added to the semiconductor layers, respectively. Then, thermal processing by thermal annealing method using an anneal furnace is performed at 550° C. for four hours in a nitrogen atmosphere (FIG. 10G).

Next, a second interlayer insulating film 38 of an inorganic or organic insulating material is formed on the first interlayer insulating film 37. In this example, after forming a silicon nitride film in 50 nm thick by CVD method, a silicon oxide film in 400 nm thick is formed.

After the thermal processing, hydrogenation processing can be performed. In this example, the thermal processing is performed at 410° C. for one hour in a nitrogen atmosphere by using an anneal furnace.

Figure 10H:
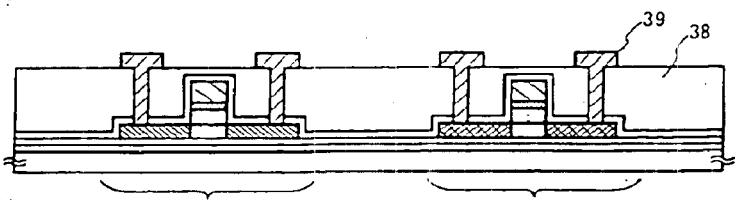

Next, a wiring 39 is formed for connecting to the impurity regions electrically. In this example, the wiring 39 is formed by patterning a laminate film of a Ti film in 50 nm thick, an Al—Si film in 500 nm thick and a Ni film in 50 nm thick. Naturally, the construction is not limited to the two-layer construction, but may be a single layer construction or a laminate construction having three or more layers. The material of the wiring is not limited to Al and Ti. For example, Al and/or Cu may be formed on a TaN film. Then, a laminate film having a Ti film may be patterned to form a wiring (FIG. 10H).

In this way, the n-channel TFT 51 and the p-channel TFT 52 are formed, both having the channel length of 6 μm and the channel width of 4 μm.

Figure 11A:
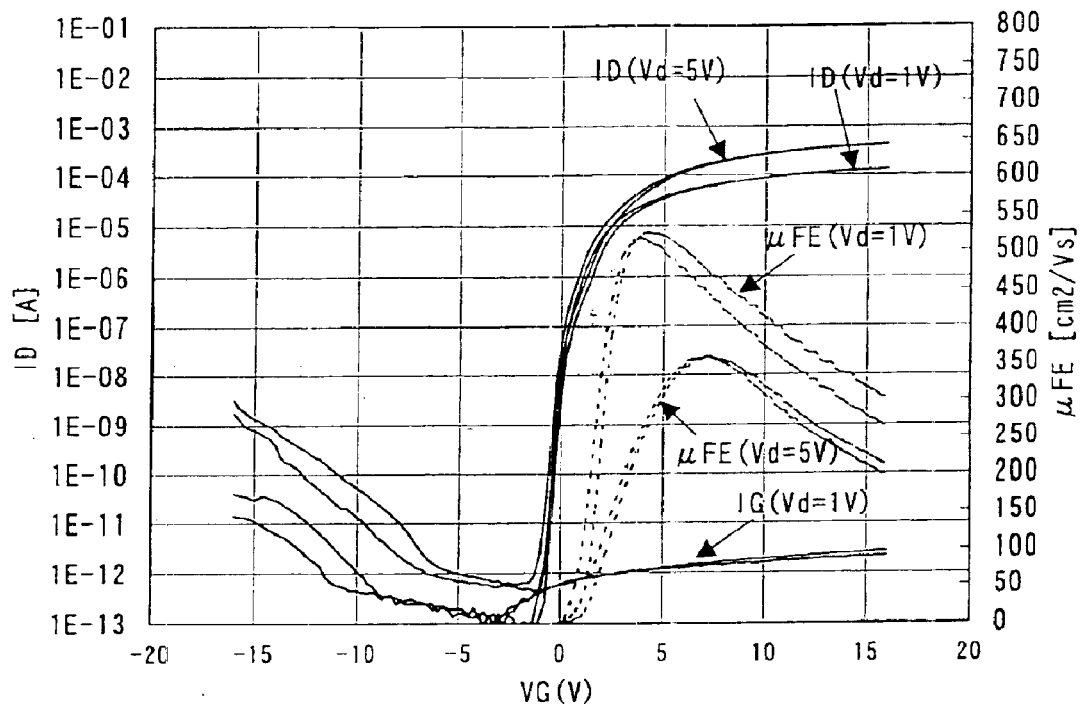
FIGS. 11A and 11B are graphs illustrating electric characteristics of TFTs.
Figure 11B:
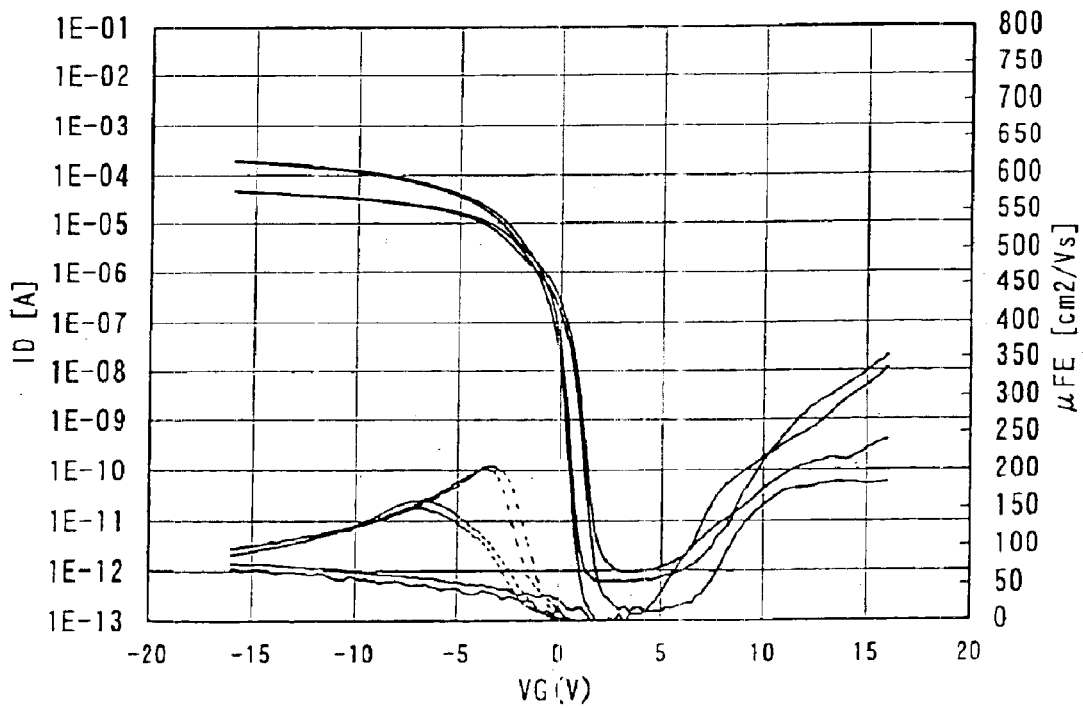

FIGS. 11A and 11B show results of measuring these electrical characteristics. FIG. 11A shows an electric characteristic of the n-channel TFT 51. FIG. 11B shows an electric characteristic of the p-channel TFT 52. The electric characteristics are measured at two measurement points in a range of gate voltage Vg=−16 to 16 V and in the range of drain voltage Vd=1 V and 5 V. In FIGS. 11A and 11B, the drain current (ID) and the gate current (IG) are indicated by solid lines. The mobility (μFE) is indicated by a dotted line.

Because large crystal grains are formed in the semiconductor film crystallized according to the above-described -method, the number of crystal grain boundaries containing the channel forming region can be reduced when a TFT is manufactured by using the semiconductor film.

Furthermore, because the formed crystal grains direct to the same direction, the number of times of crossing the crystal grain boundaries by carriers can be extremely reduced. Therefore, a TFT having the good electric characteristic can be obtained as shown in FIGS. 11A and 11B. Especially, the mobility is 524 $cm^2/Vs$ in the n-channel TFT and 205 $cm^2/Vs$ in the p-channel TFT.

The method for activating the semiconductor film by using a continuous wave laser shown in this example is applicable to the TFT constituting a circuit block that needs high-speed operation. In particular, when the channel direction of the TFT is nearly in parallel (desirably, from −30° to 30°) with the scanning direction of the laser beam for the substrate, the operational characteristic of the circuit block virtually identical to that of a circuit block formed on a monocrystal silicon substrate can be obtained.

EXAMPLE 5

In this example, a case where a TFT is manufactured by using a semiconductor film crystallized by using the method described in Example 3 will be described with reference to FIGS. 6, 12, 14 and 15.

Figure 12A:
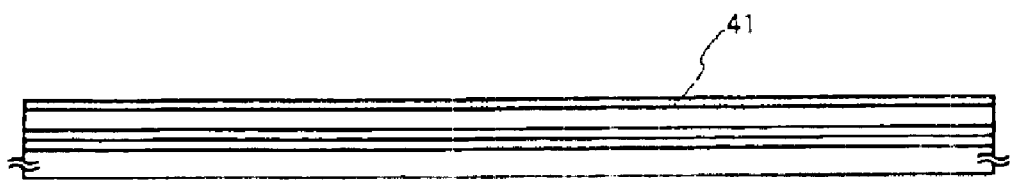
FIGS. 12A–12C are sectional views illustrating the steps of crystallizing the semiconductor.

The steps up to forming the amorphous silicon film as the semiconductor film are the same as Example 4. The amorphous silicon film is formed in 150 nm thick (FIG. 12A).

Figure 12B:
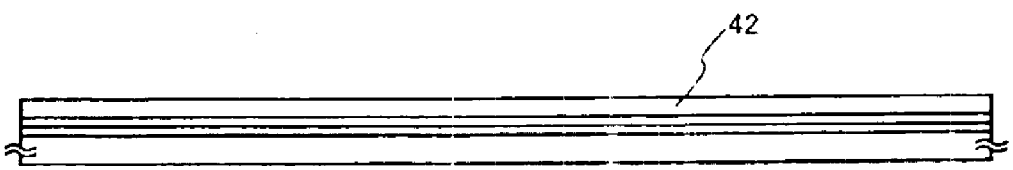

After that, the method disclosed in the Japanese Patent Application Laid-Open No. Hei 7-183540 is used. Nickel acetate solution (5 ppm in weight conversion concentration and 10 ml in volume) is coated on the semiconductor film by spin coating method to form a metal containing layer 41. Then, thermal processing is performed thereon in a nitrogen atmosphere at 500° C. for one hour and in a nitrogen atmosphere at 550° C. for twelve hours. Then, a semiconductor film 42 is obtained (FIG. 12B).

Then, the crystallinity of the semiconductor film 42 is improved by laser annealing method.

As the laser used for laser annealing method, continuous wave $YVO_4$ laser is used. For the condition for the laser annealing method, the second harmonic (wavelength 532 nm, 5.5 W) of the $YVO_4$ laser is used as laser light. The elliptical beam of 200 μm×50 μm is formed having incident angle φ of about 20° of laser light with respect to the convex lens 603 in the optical system shown in FIG. 6. The elliptical beam is moved and irradiated to the substrate at the speed of 20 cm/s or 50 cm/s. Thus, the crystallinity of the semiconductor film 42 is improved. As a result, a semiconductor film 43 is obtained (FIG. 12C).

Figure 12C:
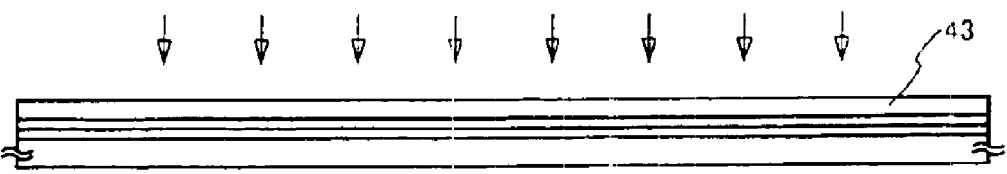

The steps after the crystallizing the semiconductor film in FIG. 12C are the same as the steps shown in FIGS. 10C to 10H shown in Example 5. In this way, the n-channel TFT 51 and the p-channel TFT 52 are formed, both having the channel length of 6 μm and the channel width of 4 μm. These electrical characteristics are measured.

FIGS. 13A to 15B show electric characteristics of the TFT manufactured through these steps.

Figure 13A:
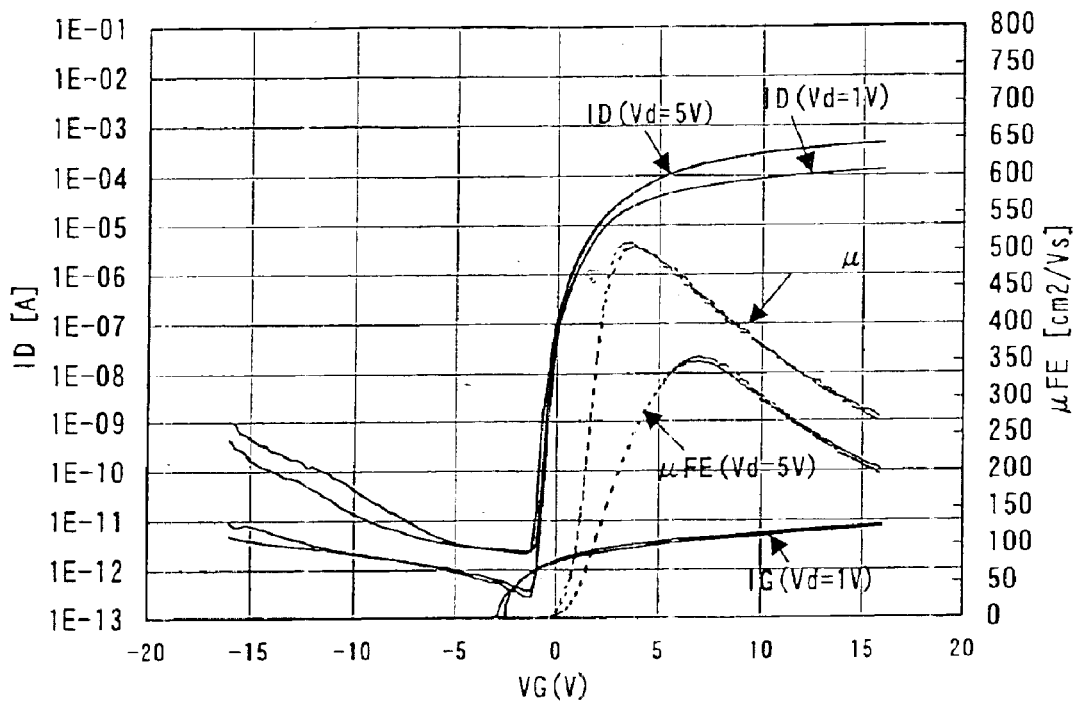
FIGS. 13A and 13B are graphs illustrating electric characteristics of TFTs.
Figure 13B:
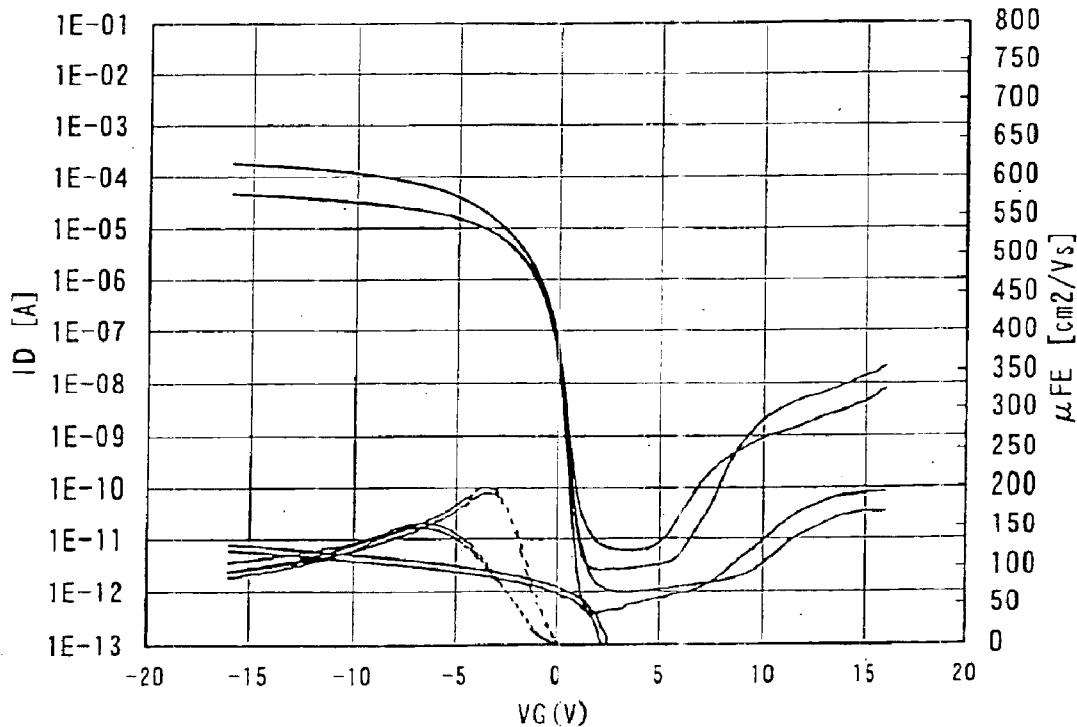
Figure 14A:
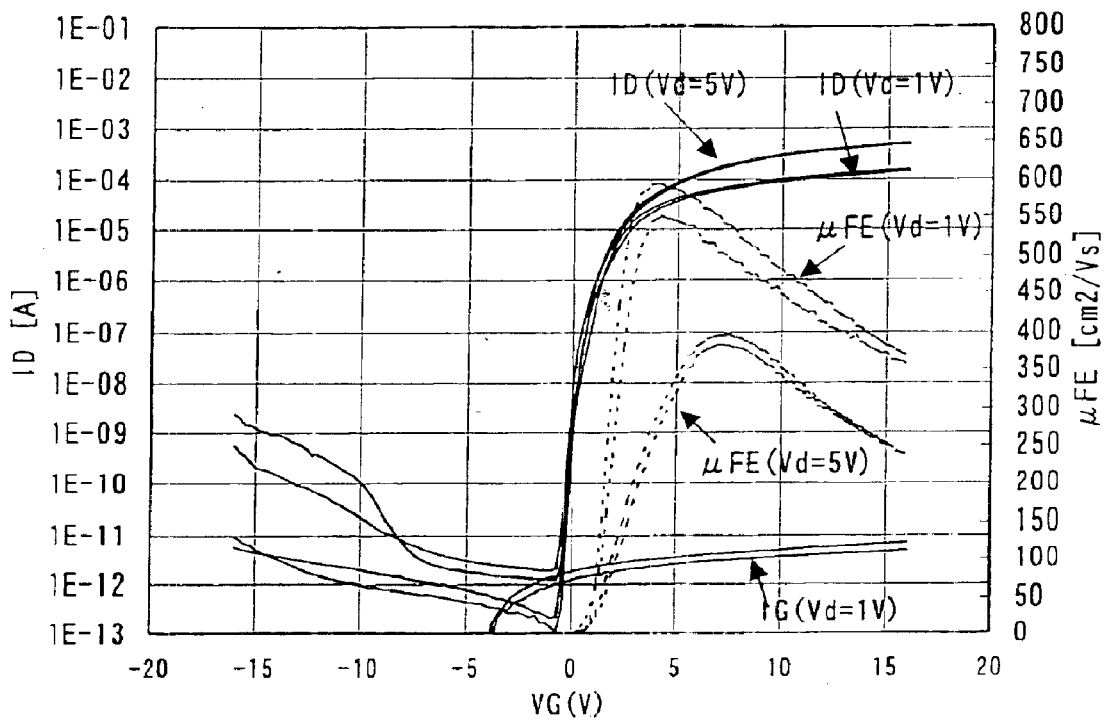
FIGS. 14A and 14B are graphs illustrating electric characteristics of TFTs.
Figure 14B:
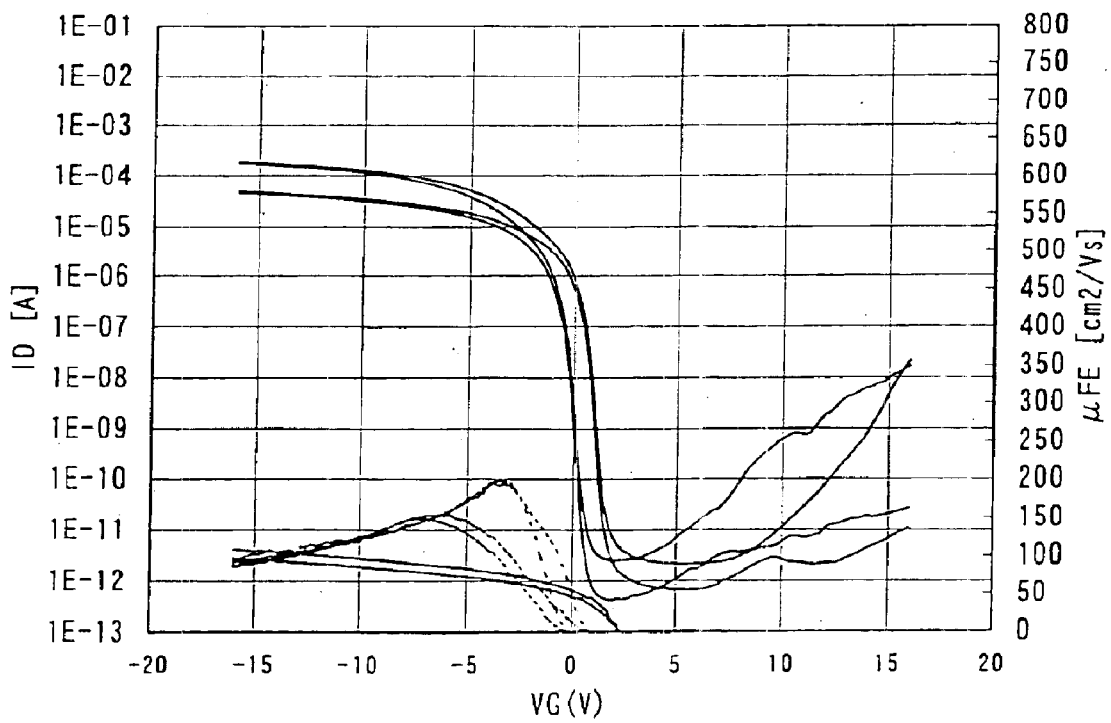

FIGS. 13A and 13B show these electrical characteristics of a TFT manufactured by moving the substrate at the speed of 20 cm/s in the laser annealing step in FIG. 12C. FIG. 13A shows an electric characteristic of the n-channel TFT 51. FIG. 13B shows an electric characteristic of the p-channel TFT 52. FIGS. 14A and 14B show these electrical characteristics of a TFT manufactured by moving the substrate at the speed of 50 cm/s in the laser annealing step in FIG. 12C. FIG. 14A shows an electric characteristic of the n-channel TFT 51. FIG. 14B shows an electric characteristic of the p-channel TFT 52.

The electric characteristics are measured in a range of gate voltage Vg=−16 to 16 V and in the range of drain voltage Vd=1 V and 5 V. In FIGS. 13A to 14B, the drain current (ID) and the gate current (IG) are indicated by solid lines. The mobility (μFE) is indicated by a dotted line.

Because large crystal grains are formed in the semiconductor film crystallized according to the present invention, the number of crystal grain boundaries contained in the channel forming region can be reduced when a TFT is manufactured by using the semiconductor film. Furthermore, the formed crystal grains direct to the same direction. In addition, the small number of grain boundaries is laid in a direction crossing the relative scanning direction of laser light. Therefore, the number of times of crossing the crystal grain boundaries by carriers can be extremely reduced.

Accordingly, a TFT having the good electric characteristic can be obtained as shown in FIGS. 13A to 14B. Especially, the mobility is 510 cm$^2$/Vs in the n-channel TFT and 200 cm$^2$/Vs in the p-channel TFT in FIGS. 13A and 14B. The mobility is 595 cm$^2$/Vs in the n-channel TFT and 199 cm$^2$/Vs in the p-channel TFT in FIGS. 14A and 14B. When a semiconductor apparatus is manufactured by using this type of TFT, the operational characteristic and the reliability can be also improved.

Figure 15A:
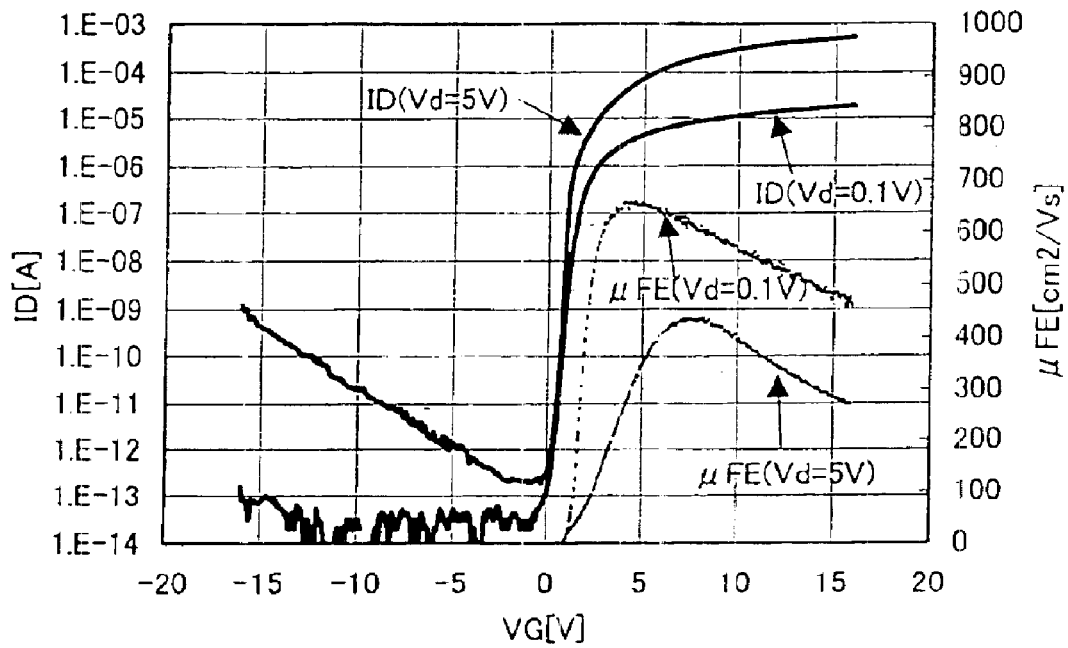
FIGS. 15A and 15B are graphs illustrating electric characteristics of TFTs.
Figure 15B:
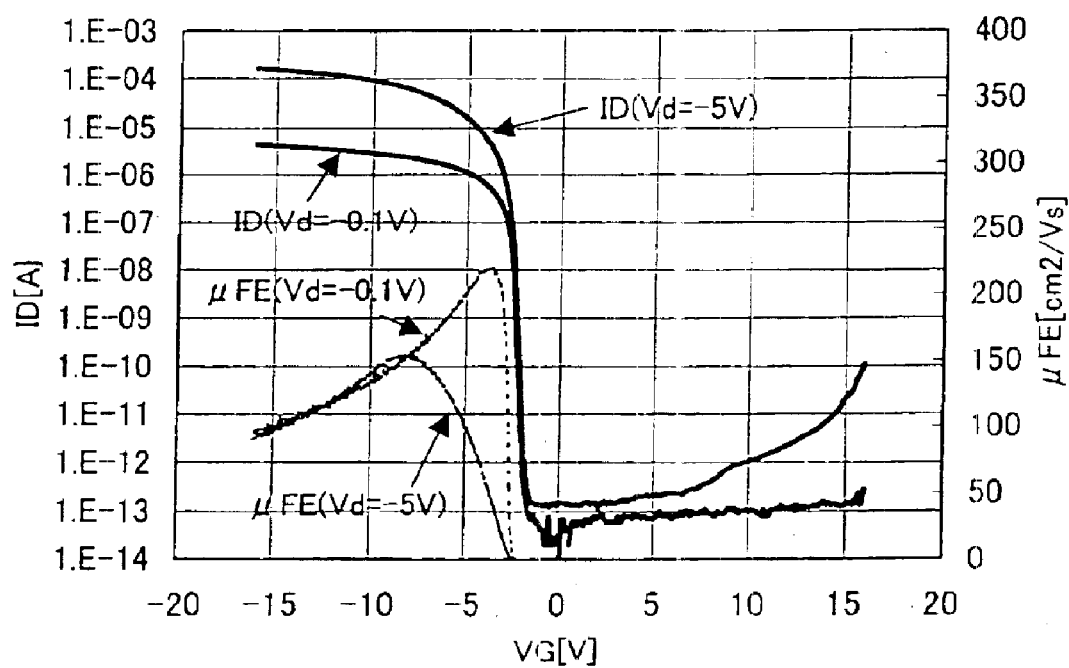

FIGS. 15A and 15B show these electrical characteristics of a TFT manufactured by moving the substrate at the speed of 50 cm/s in the laser annealing step in FIG. 12C. FIG. 15A shows an electric characteristic of the n-channel TFT 51. FIG. 15B shows an electric characteristic of the p-channel TFT 52.

The electric characteristics are measured in a range of gate voltage Vg=−16 to 16 V and in the range of drain voltage Vd=0.1 V and 5 V.

As shown in FIGS. 15A and 15B, a TFT having the good electric characteristic can be obtained. Especially, the mobility is 657 cm$^2$/Vs in the n-channel TFT in FIG. 15A and 219 cm$^2$/Vs in the p-channel TFT in FIG. 15B. When a semiconductor apparatus is manufactured by using this type of TFT, the operational characteristic and the reliability can be also improved.

The method for activating the semiconductor film by using a continuous wave laser shown in this example is applicable to the TFT constituting a circuit block that need high-speed operation. In particular, when the channel direction of the TFT is nearly in parallel (desirably, within 30°) with the scanning direction of the laser beam for the substrate, the operational characteristic of the circuit block virtually identical to that of a circuit block formed over a monocrystal silicon substrate can be obtained.

EXAMPLE 6

In this example, the manufacturing steps of a semiconductor device in which a plurality of circuits and an active matrix liquid display portion are integrated over one substrate will be described with reference to FIGS. 3A and 4D.

Figure 4A:
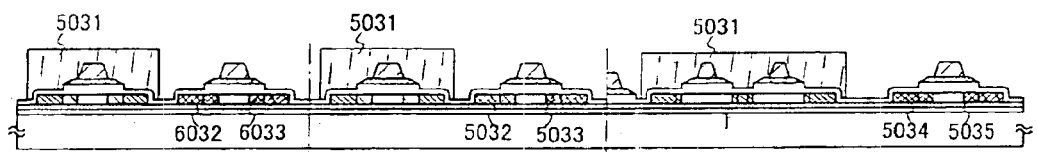
FIGS. 4A–4D are sectional views illustrating the steps of manufacturing TFTs for constituting the semiconductor device of this invention.
Figure 4B:
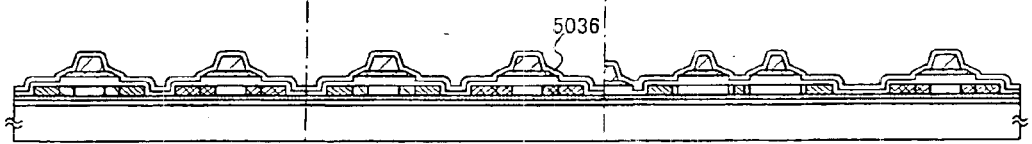
Figure 4C:
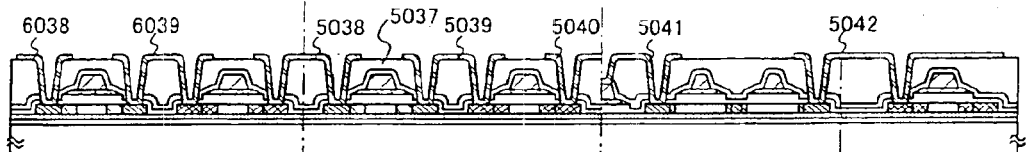
Figure 4D:
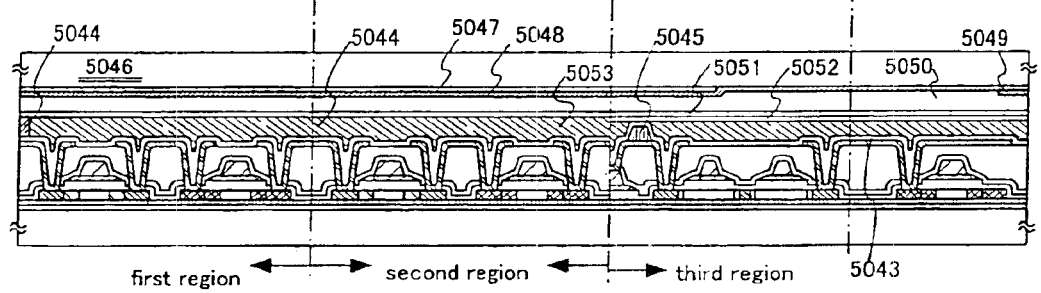

Cross-sectional views shown in FIGS. 3A and 4D comprise a first region, a second region and a third region.

The first region is a circuit block that particularly requires high-speed operation (for example, a CPU, a signal driver circuit and the like), in which a method for crystallizing a semiconductor film by using continuous wave laser is performed in the invention. Further, the second region denotes circuit blocks other than that of the first region (for example, a scanning driver circuit), while the third region denotes a pixel region.

In addition, an n-channel TFT and a p-channel TFT representing a circuit block and an n-channel TFT (a pixel TFT) and a storage capacitor representing a pixel region are shown in FIGS. 3A to 4D.

A quartz substrate, a silicon substrate, or a metal or stainless substrate formed with an insulating film on its surface is used as a substrate 5000. Further, a plastic substrate having heat-resistance, which can withstand a process temperature in the manufacturing process, may also be used. In this example, there is used the substrate 5000 made of glass such as barium borosilicate glass or alumino borosilicate glass.

Next, a base film 5001 comprised of an insulating film such as a silicon oxide film, a silicon nitride film, or a silicon oxynitride film is formed on the substrate 5000. The base film 5001 in this example takes a two-layer structure. However, there may be adopted a single layer structure of the insulating film or a structure in which two or more layers of the insulating film are laminated.

In this example, as the first layer of the base film 5001, a silicon oxynitride film 5001*a* is formed from SiH$_4$, NH$_3$, and N$_2$O as a reaction gas to have a thickness of 10 to 200 nm (preferably 50 to 100 nm) by plasma CVD method. In this example, the silicon oxynitride film 5001*a* is formed with a thickness of 50 nm. Then, as the second layer of the base film 5001, a silicon oxynitride film 5001*b* is formed from SiH$_4$ and N$_2$O as a reaction gas to have a thickness of 50 to 200 nm (preferably 100 to 150 nm) by plasma CVD method. In this example, the silicon oxynitride film 5001*b* is formed with a thickness of 100 nm.

Subsequently, semiconductor layers 5002 to 5005, 6002 and 6003 are formed on the base film 5001. As to the semiconductor layers 5002 to 5005, 6002 and 6003, a semiconductor film is formed with a thickness of 25 to 80 nm (preferably 30 to 60 nm) by known means (sputtering method, LPCVD method, plasma CVD method, or the like). Note that an amorphous semiconductor film, a microcrystalline semiconductor film, a crystalline semiconductor film, a compound semiconductor film with an amorphous structure such as an amorphous silicon germanium film, or the like may be used as the semiconductor film.

Next, a first crystallization is performed to the second and the third regions, or throughout the substrate of the semiconductor film. As a first crystallization method, known crystallization methods (laser crystallization method, thermal crystallization method using RTA or furnace annealing, thermal crystallization method using a metal element that promotes crystallization, or the like) may be used.

In this example, a 55-nm-thick amorphous silicon film is formed by using plasma CVD method. Then, as the first crystallization method, a solution containing nickel is applied onto the amorphous silicon film, dehydrogenation (500° C., 1 hour) is performed to the amorphous silicon film, and then, thermal crystallization (550° C., 4 hours) is conducted thereto, thereby forming a crystalline silicon film.

Note that in case that the first crystalline semiconductor film is formed by the laser crystallization method, the crystallization can be performed to only the second and third regions, or throughout the substrate of the semiconductor film. As the laser, used may be a pulse oscillation type gas laser or solid laser. As the former gas laser, an excimer laser, YAG laser, YVO$_4$ laser, YLF laser, YAlO$_3$ laser, glass laser, ruby laser, Ti:sapphire laser, or the like may be used. Also, as the latter solid laser, there may be used a laser which uses crystals such as YAG, YVO4, YLF, or YAlO$_3$ which is doped with Cr, Nd, Er, Ho, Ce, Co, Ti or Tm. A fundamental wave of the laser concerned differs depending on the material to be doped, and the laser light having a fundamental wave of about 1 μm is obtained. A harmonic wave with respect to the fundamental wave can be obtained by using a non-linear optical element.

The crystallization conditions are appropriately set. However, in the case of using an excimer laser, it is preferable that the pulse oscillation frequency is 300 Hz and the laser energy density is 100 to 700 mJ/cm$^2$ (typically 200 to 300 mJ/cm$^2$). Further, in the case of using a YAG laser, it is preferable that the pulse oscillation frequency is 1 to 300 Hz and the laser energy density is 300 to 1000 mJ/cm$^2$ (typically 350 to 500 mJ/cm$^2$) by using the second harmonic wave. The laser light condensed into a linear shape with a width of 100 to 1000 μm (preferably width of 400 μm) is irradiated to the entire surface of the substrate. The overlap ratio of the linear beam at this time may be 50 to 98%.

Subsequently, a second crystallization is performed to the semiconductor film of the first region. A continuous wave laser is used for a second crystallization method. The methods for crystallization by using a continuous wave laser shown in Examples 2 and 3 can be adopted. Thus, a second crystalline silicon is obtained.

Through these semiconductor crystallization processes, the first crystalline silicon film is formed in the first region including the circuit block that requires high-speed operation, and the second crystalline silicon formed in other regions, respectively.

Since large crystal grains extend in the relative scanning direction of the laser beam in the first crystalline silicon film, the TFT in which the first crystalline silicon film functions as an active layer has good electric characteristic.

In particular, when the channel direction is nearly in parallel to the scanning direction of the laser beam, the number of times that the carriers cross the crystal grain boundary can be extremely reduced, the electric characteristic identical to that of TFTs formed on a monocrystal silicon can be obtained.

On the other hand, since continuous wave laser has a narrow beamwidth (50 to 500 μm), using such a crystallization process to a wide region has a disadvantage from the viewpoint of throughput. In the invention, the crystallization using continuous wave laser is confined to a limited region over the substrate to improve the throughput.

Subsequently, the semiconductor layers 5002 to 5005, 6002 and 6003 are formed by a patterning process using a photolithography method.

However, in this example, since the crystallization of the amorphous silicon film is conducted by using the metal element that promotes crystallization, the metal element remains in the crystalline silicon film. Therefore, an amorphous silicon film with a thickness of 50 to 100 nm is formed over the crystalline silicon film, and heat treatment (thermal annealing using RTA or furnace annealing, or the like) is performed thereto to diffuse the metal element into the amorphous silicon film. After the heat treatment, the amorphous silicon film is removed by conducting etching. As a result, the metal element in the crystalline silicon film can be reduced in content or removed.

Note that, after the semiconductor layers 5002 to 5005, 6002 and 6003 are formed, doping of a minute amount of impurity element (boron or phosphorus) may be conducted for controlling the threshold value of the TFT.

Subsequently, a gate insulating film 5006 is formed which covers the semiconductor layers 5002 to 5005, 6002 and 6003. The gate insulating film 5006 is formed of an insulating film containing silicon to have a thickness of 40 to 150 nm by using plasma CVD method or sputtering method. In this example, as the gate insulating film 5006, a silicon oxynitride film is formed with a thickness of 110 nm by plasma CVD method. Of course, the gate insulating film 5006 is not limited to the silicon oxynitride film, and another insulating film containing silicon may be used in a single layer structure or a laminate structure.

Note that, in the case where a silicon oxide film is used as the gate insulating film 5006, the gate insulating film may be formed such that: TEOS (tetraethyl orthosilicate) and O2 are mixed by the plasma CVD method; a reaction pressure of 40 Pa and a substrate temperature of 300 to 400° C. are set; and an electric discharge is made with a high frequency (13.56 MHz) power density of 0.5 to 0.8 W/cm$^2$. The silicon oxide film formed through the above step can obtain a satisfactory characteristic as the gate insulating film 5006 by subsequent thermal annealing at 400 to 500° C.

Then, over the gate insulating film 5006, a first conductive film 5007 with a thickness of 20 to 100 nm and a second conductive film 5008 with a thickness of 100 to 400 nm are formed in lamination. In this example, the first conductive film 5007 comprised of a 30 nm thick TaN film and the second conductive film 5008 comprised of a 370 nm thick W film are formed in lamination.

In this example, the TaN film as the first conductive film 5007 is formed using a Ta target in an atmosphere containing nitrogen by sputtering method. Further, the W film as the second conductive film 5008 is formed using a W target by sputtering method. In addition, the W film may be formed by thermal CVD method with the use of tungsten hexafluoride (WF6).

Note that the TaN film and the W film are used as the first conductive film 5007 and the second conductive film 5008, respectively, in this example, but the materials for constituting the first conductive film 5007 and the second conductive film 5008 are not particularly limited. The first conductive film 5007 and the second conductive film 5008 each may be formed from an element selected from the group consisting of Ta, W, Ti, Mo, Al, Cu, Cr and Nd, or an alloy material or compound material which contains the element as a main constituent. Further, the conductive films may be formed of a semiconductor film typified by a polycrystalline silicon film doped with an impurity element such as phosphorus or an AgPdCu alloy.

Next, a mask 5009 is formed of resist by using a photolithography method, and a first etching process for forming electrodes and wirings is performed. The first etching process is performed under first and second etching conditions. (FIG. 3B)

In this example, as to the first etching conditions, etching is performed by using an ICP (inductively coupled plasma) etching method such that: $CF_4$, $C_{12}$ and $O_2$ are used as an etching gas; the gas flow rate is set to 25:25:10 sccm; and an RF (13.56 MHz) power of 500 W is applied to a coil shape electrode under a pressure of 1.0 Pa to generate plasma. An RF (13.56 MHz) power of 150 W is also applied to the substrate side (sample stage), and a substantially negative self-bias voltage is applied thereto. Then, the W film is etched under the first etching conditions to form end portions of the first conductive film 5007 into a tapered shape.

Subsequently, the first etching conditions are changed into the second etching conditions without removing the mask 5009 made of resist. Etching is performed for about 15 seconds such that: $CF_4$ and $Cl_2$ are used as an etching gas;

the gas flow rate is set to 30:30 sccm; and an RF (13.56 MHz) power of 500 W is applied to a coil shape electrode under a pressure of 1.0 Pa to generate plasma. An RF (13.56 MHz) power of 20 W is also applied to the substrate side (sample stage), and a substantially negative self-bias voltage is applied thereto. Under the second etching conditions, both the first conductive layer 5007 and the second conductive layer 5008 are etched to substantially the same level. Note that an etching time may be increased at a rate of about 10 to 20% in order to perform etching without residue on the gate insulating film 5006.

In the first etching process, the mask made of resist is formed into an appropriate shape, whereby the end portions of the first conductive layer 5007 and of the second conductive layer 5008 are formed into a tapered shape due to an effect of the bias voltage applied to the substrate side. In this way, first shape conductive layers 5010 to 5014, 6010 and 6011 that each consist of the first conductive layer 5007 and the second conductive layer 5008 are formed by the first etching process. In the gate insulating film 5006, the regions reduced in thickness are formed because the regions are not covered by the first shape conductive layers 5010 to 5014, 6010 and 6011 and etched by about 20 to 50 nm.

Next, a second etching process is performed without removing the mask 5009 made of resist. (FIG. 3C) In the second etching process, etching is performed for about 25 seconds such that: $SF_6$, $Cl_2$ and $O_2$ are used as an etching gas; the gas flow rate is set to 24:12:24 sccm; an RF (13.56 MHz) power of 700 W is applied to the coil side under a pressure of 1.3 Pa to generate plasma. An RF (13.56 MHz) power of 10 W is also applied to the substrate side (sample stage), and a substantially negative self-bias voltage is applied. In this way, the W film is selectively etched to form second shape conductive layers 5015 to 5019, 6015 and 6016. At this time, first conductive layers 5015a to 5019a, 6015a and 6016a are hardly etched.

Then, a first doping process is performed without removing the mask 5009 made of resist to add an impurity element imparting n-type conductivity to the semiconductor layers 5002 to 5005, 6002 and 6003 at a low concentration. The first doping process may be conducted by an ion doping method or an ion implantation method. As to the conditions of the ion doping method, doping is performed with a dosage of $1\times10^{13}$ to $5\times10^{14}$ atoms/cm$^2$ and an acceleration voltage of 40 to 80 keV. In this example, doping is performed with a dosage of $5.0\times10^{13}$ atoms/cm$^2$ and an acceleration voltage of 50 keV. An element belonging to group 15 may be used as the impurity element imparting n-type conductivity. Phosphorous (P) or arsenic (As) is typically used, and phosphorus (P) is used in this example. In this case, the second shape conductive layers 5015 to 5019, 6015 and 6016 serve as masks against the impurity element imparting n-type conductivity, and first impurity regions (n⁻regions) 5020 to 5023, 6020 and 6021 are formed in a self-aligning manner. Then, the impurity element imparting n-type conductivity is added to the first impurity regions 5020 to 5023, 6020 and 6021 in a concentration range of $1\times10^{18}$ to $1\times10^{20}$ atoms/cm$^3$.

Subsequently, after the mask 5009 made of resist is removed, a mask 5024 made of resist is newly formed, and a second doping process is performed at an acceleration voltage higher than that in the first doping process. As to the conditions of the ion doping method, doping is performed with a dosage of $1\times10^{13}$ to $3\times10^{15}$ atoms/cm$^2$ and an acceleration voltage of 60 to 120 keV. In this example, doping is performed with a dosage of $3.0\times10^{15}$ atoms/cm$^2$ and an acceleration voltage of 65 keV. The second doping process is performed using second conductive layers 5015b to 5018b, 6015b and 6016b as masks against the impurity element such that the impurity element is added to the semiconductor layers under the tapered portions of the first conductive layers 5015a to 5018a, 6015a and 6016a. Subsequently, a third doping process is performed by lowering the acceleration voltage to obtain the state of FIG. 3D. Dosage is set to $1\times10^{15}$ to $1\times10^{17}$ atoms/cm$^3$ and acceleration voltage is set to 50 to 100 keV as the conditions of ion doping.

As a result of conducting the second and third doping processes, a second impurity regions (n– region, Lov region) 5026 and 6026 which overlap the first conductive layer is added with the impurity element imparting n-type conductivity in a concentration range of $1\times10^{18}$ to $5\times10^{19}$ atoms/cm$^3$. Also, third impurity regions (n⁺ regions) 5025, 5028 and 6025 are added with the impurity element imparting n-type conductivity in a concentration range of $1\times10^{19}$ to $5\times10^{21}$ atoms/cm$^3$. Further, after the first and second doping processes, regions to which no impurity element is completely added or regions to which a minute amount of impurity element is added are formed in the semiconductor layers 5002 to 5005, 6002 and 6003. In this example, the regions to which no impurity element is added or the regions to which a minute amount of impurity element is added are called channel regions 5027, 5030 and 6027. Further, among the first impurity regions (n⁻regions) 5020 to 5023, 6020 and 6021 formed by the first doping process, a region exists which is covered by the resist 5024 in the second doping process. The region is continuously called a first impurity region (n⁻region, LDD region) 5029 in this example.

Note that the second impurity regions (n– region) 5026, 6026 and the third impurity regions (n⁺ regions) 5025, 5028 and 6025 are formed by only the second doping process in this example, but the present invention is not limited to this. The above regions may be formed by plural doping processes while appropriately changing the doping process conditions.

Then, as shown in FIG. 4A, after the mask 5024 made of resist is removed, a mask 5031 made of resist is newly formed. Thereafter, a fourth doping process is performed. Through the fourth doping process, fourth impurity regions (p⁻ regions) 5032, 5034, 6032 and fifth impurity regions (p⁻ regions) 5033, 5035, 6033, which are added with an impurity element imparting conductivity opposite to the first conductivity, are formed into the semiconductor layers that serve as active layers of p-channel TFTs.

In the fourth doping process, the second conductive layers 5016b and 5018b are used as masks against the impurity element. In this way, the impurity element imparting p-type conductivity is added to form the fourth impurity regions (p+ regions) 5032, 5034, 6032 and the fifth impurity regions (p⁻ regions) 5033, 5035, and 6033 in a self-aligning manner.

In this example, the fourth impurity regions 5032, 5034, 6032 and the fifth impurity regions 5033, 5035, 6033 are formed by an ion doping method using diborane ($B_2H_6$). As the conditions of the ion doping method, a dosage of $1\times10^{16}$ atoms/cm$^2$ and an acceleration voltage of 80 keV are adopted.

Note that the semiconductor layers for forming n-channel TFTs are covered with the mask 5031 made of resist in the fourth doping process.

Here, by the first and second doping processes, the fourth impurity regions (p⁻ regions) 5032, 5034, 6032 and the fifth impurity regions (p⁻ regions) 5033, 5035, 6033 have been added with phosphorus it different concentrations. However, any of the fourth impurity regions (p+ regions) 5032, 5034, 6032 and the fifth impurity regions (p− regions) 5033, 5035, 6033 is subjected to the fourth doping process such that the concentration of the impurity element imparting p-type conductivity is $1\times10^{19}$ to $5\times10^{21}$ atoms/cm$^3$. Thus, the fourth impurity regions (p+ regions) 5032, 5034, 6032 and the fifth impurity regions (p− regions) 5033, 5035, 6033 function as source regions and drain regions of the p-channel TFTs without problems.

Note that the fourth impurity regions. (p+ regions) 5032, 5034, 6032 and the fifth impurity regions (p− regions) 5033, 5035, 6033 are formed by only the fourth doping process in this example, but the present invention is not limited to this. The above regions may be formed by plural doping processes while appropriately changing the doping process conditions.

Then, as shown in FIG. 4B, the mask 5031 made of resist is removed, and then, a first interlayer insulating film 5036 is formed. As the first interlayer insulating film 5036, an insulating film containing silicon is formed to have a thickness of 100 to 200 nm by using plasma CVD method or sputtering method. In this example, a silicon oxynitride film with a thickness of 100 nm is formed by plasma CVD method. Of course, the first interlayer insulating film 5036 is not limited to the silicon oxynitride film, and another insulating film containing silicon may be used in a single layer or laminate structure.

Then, as shown in FIG. 4C, heat treatment (thermal treatment) is conducted to recover the crystallinity of the semiconductor layers and activate the impurity elements added to the semiconductor layers. The heat treatment is conducted by a thermal annealing method using furnace annealing. The thermal annealing method is preferably conducted in a nitrogen atmosphere at an oxygen concentration of 1 ppm or less, preferably 0.1 ppm or less at 400 to 700° C. In this example, the activation process is performed by thermal treatment at 410° C. for 1 hour. Note that, in addition to the thermal annealing method, a laser annealing method or a rapid thermal annealing method (RTA method) may be applied.

Further, heat treatment may be performed before the formation of the first interlayer insulating film 5036. Incidentally, in the case where the materials that constitute the first conductive layers 5015a to 5019a, 6015a and 6015b and the second conductive layers 5015b to 5019b, 6015b and 6016b are easily affected by heat, it is preferable that heat treatment is conducted after the first interlayer insulating film 5036 (insulating film containing silicon as a main constituent, for example, silicon nitride film) is formed in order to protect wirings and the like, as in this example.

Heat treatment is conducted after the formation of the first interlayer insulating film 5036 (insulating film containing silicon as a main constituent, for example, silicon nitride film) as described above, whereby hydrogenation of the semiconductor layers can be performed simultaneously with the activation process. In the hydrogenation step, dangling bonds of the semiconductor layers are terminated by hydrogen contained in the first interlayer insulating film 5036.

Note that heat treatment for hydrogenation may be performed in addition to the heat treatment for the activation process.

Here, the semiconductor layers can be hydrogenated irrespective of the existence of the first interlayer insulating film 5036. As another means for hydrogenation, there may be used means with the use of hydrogen excited by plasma (plasma hydrogenation) or means of conducting heat treatment at 300 to 450° C. for 1 to 12 hours in an atmosphere containing 3 to 100% of hydrogen.

Next, a second interlayer insulating film 5037 is formed over the first interlayer insulating film 5036. An inorganic insulating film may be used as the second interlayer insulating film 5037. For example, a silicon oxide film formed by a CVD method, a silicon oxide film applied by an SOG (spin on glass) method, or the like may be used. In addition, as the second interlayer insulating film 5037, an organic insulating film may be used. For example, a film made of polyimide, polyamide, BCB (benzocyclobutene), acrylic, or the like may be used. Further, a laminate structure of an acrylic film and a silicon oxynitride film may also be used.

In this example, an acrylic film with a thickness of 1.6 µm is formed. The second interlayer insulating film 5037 can reduce unevenness due to the TFTs formed over the substrate 5000 and provide levelness. Particularly, the second interlayer insulating film 5037 is provided mainly for attaining levelness, and thus is preferably a film excellent in levelness.

Next, the second interlayer insulating film 5037, the first interlayer insulating film 5036, and the gate insulating film 5006 are etched by using dry etching or wet etching, thereby forming contact holes that reach the third impurity regions 5025, 5028, 6025 and the fourth impurity regions 5032, 5034, 6032.

Subsequently, wirings 5038 to 5041, 6038, 6039 and a pixel electrode 5042, which are electrically connected with the respective impurity regions, are formed. Note that these wirings are formed by patterning a laminate film consisting of a 50 nm thick Ti film and a 500 nm thick alloy film (alloy film of Al and Ti). Of course, the present invention is not limited to a two-layer structure, and a single layer structure or a laminate structure of three or more layers may be adopted. Further, the materials for wirings are not limited to Al and Ti. For example, the wirings may be formed by patterning a laminate film in which an Al film or a Cu film is formed on a TaN film, and a Ti film is further formed thereon. In any case, a material excellent in reflecting property is desirably used.

Thereafter, an orientation film 5043 is formed over a portion at least containing the pixel electrode 5042, and a rubbing process is performed thereto. Note that, in this example, a columnar spacer 5045 for maintaining a substrate interval is formed at a desired position by patterning an organic resin film such as an acrylic resin film before the orientation film 5043 is formed. Further, a spherical spacer may be scattered over the surface of the substrate instead of the columnar spacer.

Next, a counter substrate 5046 is prepared. Colored layers (color filters) 5047 to 5049 and a leveling film 5050 are formed over the counter substrate 5046. At this time, the first colored layer 5047 and the second colored layer 5048 are overlapped to form a light shielding portion. Further, the first colored layer 5047 and the third colored layer 5049 may be partially overlapped to form a light shielding portion. Alternatively, the second colored layer 5048 and the third colored layer 5049 may be partially overlapped to form a light shielding portion.

In this way, a gap between pixels is shielded against light by the light shielding portion comprised of a lamination layer of the colored layers without newly forming a light shielding portion. Thus, the number of steps can be reduced.

Then, a counter electrode 5051 comprised of a transparent conductive film is formed at least over a portion, which corresponds to a pixel portion, of the leveling film 5050, and an orientation film 5052 is formed over the substrate of the counter substrate. Then, a rubbing process is performed thereto.

Then, the active matrix substrate over which the pixel portion and the driver circuit are formed and the counter substrate are bonded to each other by a sealing material 5044. The sealing material 5044 is mixed with a filler, and the two substrates are bonded while a uniform interval is kept by the filler and the columnar spacer. Thereafter, a liquid crystal material 5053 is injected between both the substrates, and complete sealing is conducted with a sealant (not shown). A known liquid crystal material may be used as the liquid crystal material 5053. Thus, the liquid crystal display device shown in FIG. 4D is completed. Then, if necessary, the active matrix substrate or the counter substrate is cut into a desired shape. Further, a polarizing plate and an FPC (not shown) are bonded to the liquid crystal display device.

As described above, regions that require high-speed operation and regions to the contrary thereof, by varying the process of semiconductor film activation, a semiconductor device with high-speed operation in its entirety can be manufactured through a high throughput manufacturing process.

In particular, in the first region (a region having a circuit block that requires high-speed operation), the TFT having a semiconductor film in which large crystal grains are formed by performing the crystallization using wave oscillation laser is formed, thereby realizing a circuit block with high-speed operation.

In addition, the TFT manufactured in this example may be either a bottom gate structure or a dual gate structure.

EXAMPLE 7

In Example 7, steps for manufacturing a substrate over which a circuit block constituted of a thin film transistor and an EL display portion are integrated are described.

Note that, the steps up to the step shown in FIG. 5A are similar to those shown in FIGS. 3A to 3D and 4A in Example 6.

Portions similar to FIGS. 3A to 3D and 4A to 4D are indicated using the same symbols and the description is omitted here.

As shown in FIG. 5A, a first interlayer insulating film 5101 is formed. An insulating film containing silicon is formed as the first interlayer insulating film 5101 at a thickness of 100 nm to 200 nm by plasma CVD method or sputtering method. In this example, a silicon oxynitride film having a film thickness of 100 nm is formed by plasma CVD method. Of course, the first interlayer insulating film 5101 is not limited to the silicon oxynitride film, and therefore another insulating film containing silicon may be used as a single layer or a laminate structure.

Next, as shown in FIG. 5B, heat treatment (thermal processing) is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this example, the heat treatment at 410° C. for 1 hour is performed for the activation processing. However, if a laser anneal method or a rapid thermal anneal method (RTA method) can be applied in addition to the thermal anneal method.

Also, the heat treatment may be performed before the formation of the first interlayer insulating film 5101. Note that, the first conductive layers 5015*a* to 5019*a* and the second conductive layers 5015*b* to 5019*b* are sensitive to heat, it is preferable that heat treatment is performed after the first interlayer insulating film 5101 (insulating film containing mainly silicon, for example, silicon nitride film) for protecting a wiring and the like is formed as in this example.

As described above, when the heat treatment is performed after the formation of the first interlayer insulating film 5101 (insulating film containing mainly silicon, for example, silicon nitride film), the hydrogenation of the semiconductor layer can be also conducted simultaneously with the activation processing. In the hydrogenation step, a dangling bond of the semiconductor layer is terminated by hydrogen contained in the first interlayer insulating film 5101.

Note that heat treatment for hydrogenation other than the heat treatment for activation processing may be performed.

Here, the semiconductor layer can be hydrogenated regardless of the presence or absence of the first interlayer insulating film 5101. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

By the above steps, the CMOS circuit composed of the N-channel TFT and the P-channel TFT can be formed in the pixel portion.

Next, a second interlayer insulating film 5102 is formed on the first interlayer insulating film 5101. An inorganic insulating film can be used as the second interlayer insulating film 5102. For example, a silicon oxide film formed by CVD method, a silicon oxide film applied by SOG (spin on glass) method, or the like can be used. In addition, an organic insulating film can be used as the second interlayer insulating film 5102. For example, a film made of polyimide, polyamide, BCB (benzocyclobutene), acrylic, or the like can be used. Further, a laminate structure of an acrylic film and a silicon oxide film may be used. Further more, a laminate structure of an acrylic film and a silicon nitride film or a silicon oxynitride film formed by sputtering method also may be used.

Next, using dry etching or wet etching, the first interlayer insulating film 5101, the second interlayer insulating film 5102, and the gate insulating film 5006 are etched to form contact holes which reach impurity regions (third impurity regions (N+ regions) and fourth impurity regions (P+ regions)) of respective TFTs which compose the circuit block.

Next, wirings 5103 to 5109, 6103 and 6104 electrically connected with the respective impurity regions are formed. Note that, in this example, a Ti film having a film thickness of 100 mm, an Al film having a film thickness of 350 nm, and a Ti film having a film thickness of 100 nm are formed in succession by a sputtering method and a resultant laminate film is patterned in a predetermined shape so that the wirings 5103 to 5109, 6103 and 6104 are formed.

Of course, they are not limited to a three-layer structure. A single layer structure, a two-layer structure, or a laminate structure composed of four layers or more may be used. Materials of the wirings ate not limited to Al and Ti, and therefore other conductive films may be used. For example, it is preferable that an Al film or a Cu film is formed on a TaN film, a Ti film is formed thereon, and then a resultant laminate film is patterned to form the wirings.

Next, as shown in FIG. 5C, a third interlayer insulating film 5110 is formed. An inorganic insulating film or an organic insulating film can be used as the third interlayer insulating film 5110. A silicon oxide film formed by a CVD method, a silicon oxide film applied by an SOG (spin on glass) method, or the like can be used as the inorganic insulating film. In addition, an acrylic resin film or the like can be used as the organic insulating film. Further, a laminate structure of an acrylic film and a silicon nitride film or a silicon oxynitride film may be used.

When the third interlayer insulating film 5110 is formed, unevenness caused by TFTs formed over the substrate 5000 is reduced and the surface can be leveled. In particular, the third interlayer insulating film 5110 is for leveling. Thus, a film having superior evenness is preferable.

Next, using dry etching or wet etching, the third interlayer insulating film 5110 is etched to form contact holes which reach the wiring 5108.

Next, a conductive film is patterned to form a pixel electrode 5111. In the case of this example, an alloy film of aluminum and lithium is used as the conductive film. Of course, a known MgAg film (alloy film of magnesium and silver) may be used. The pixel electrode 5111 corresponds to the cathode of the EL element. A conductive film made of an element which belongs to Group 1 or Group 2 of the periodic table or a conductive film to which those elements are added can be freely used as a cathode material.

The pixel electrode 5111 is electrically connected with the wiring 5108 through a contact hole formed in the third interlayer insulating film 5110. Thus, the pixel electrode 5111 is electrically connected with one of the source region and the drain region comprising the drive circuit.

Next, as shown in FIG. 5D, banks 5112 are formed such that EL layers of respective pixels are separated from each other. The banks 5112 are formed from an inorganic insulating film or an organic insulating film. A silicon nitride film or a silicon oxynitride film formed by a sputtering method, a silicon oxide film formed by a CVD method, a silicon oxide film applied by an SOG method, or the like can be used as the inorganic insulating film. In addition, an acrylic resin film or the like can be used as the organic insulating film.

Here, when a wet etching method is used at the formation of the banks 5112, they can be easily formed as side walls having taper shapes. If the side walls of the banks 5112 are not sufficiently gentle, the deterioration of an EL layer caused by a step becomes a marked problem. Thus, attention is required.

Examples of a combination of the third interlayer insulating film 5110 and the banks 5112 will be described below.

There is a combination in which a laminate film of an acrylic and a silicon nitride film or a silicon oxynitride film formed by a sputtering method is used as the third interlayer insulting film 5110, while a silicon nitride film or a silicon oxynitride film formed by a sputtering method is used as the banks 5112. In addition, there is a combination in which a silicon oxide film formed by a plasma CVD method is used as the third interlayer insulating film 5110 and a silicon oxide film formed by a plasma CVD method is used as the banks 5112. In addition, there is a combination in which a silicon oxide film formed by an SOG method is used as the third interlayer insulating film 5110 and a silicon oxide film formed by an SOG method is used as the banks 5112. In addition, there is a combination in which a laminate film of a silicon oxide film formed by an SOG method and a silicon oxide film formed by a plasma CVD method is used as the third interlayer insulating film 5110 and a silicon oxide film formed by a plasma CVD method is used as the banks 5112. In addition, there is a combination in which acrylic is used for the third interlayer insulating film 5110 and acrylic is used for the banks 5112. In addition, there is a combination in which a laminate film of an acrylic film and a silicon oxide film formed by a plasma CVD method is used as the third interlayer insulating film 5110 and a silicon oxide film formed by a plasma CVD method is used as the banks 5112. In addition, there is a combination in which a silicon oxide film formed by a plasma CVD method is used as the third interlayer insulating film 5110 and acrylic is used for the banks 5112.

A carbon particle or a metallic particle may be added into the banks 5112 to reduce resistivity, thereby suppressing the generation of static electricity. At this time, the amount of carbon particle or metallic particle to be added is preferably adjusted such that the resistivity becomes $1\times10^6$ $\Omega$m to $1\times10^{12}$ $\Omega$m (preferably, $1\times10^8$ $\Omega$m to $1\times10^{10}$ $\Omega$m).

Next, an EL layer 5113 is formed on the pixel electrode 5038 which is surrounded by the banks 5112 and exposed.

An organic light emitting material or an inorganic light emitting material which is known can be used as the EL layer 5113.

A low molecular weight based organic light emitting material, a high molecular weight based organic light emitting material, or an intermediate molecular weight based organic light emitting material can be freely used as the organic light emitting material. Note that in this specification, an intermediate molecular weight based organic light emitting material indicates an aggregate of an organic compound which has no subliming property or dissolving property (preferably, an aggregate which has molecularity of 10 μm or less).

The EL layer 5113 has generally a laminate structure. Typically, there is a laminate structure of "a hole transporting layer, a light emitting layer, and an electron transporting layer", which has been proposed by Tang et al. in Eastman Kodak Company. In addition to this, a structure in which "an electron transporting layer, a light emitting layer, a hole transporting layer, and an hole injection layer" or "an electron injection layer, a light emitting layer, an hole transporting layer, and a hole injection layer" are laminated on an cathode in this order may be used. A light emitting layer may be doped with fluorescent pigment or the like. However, the electric charge excitation before emitting light may be triplet or singlet.

In this specification, a light emitting element can utilize either phosphorescence from triplet excitation to ground state or fluorescence emission from singlet excitation to ground state.

In this example, the EL layer 5113 is formed by an evaporation method using a low molecular weight based organic light emitting material. Specifically, a laminate structure in which a tris-8-quinolinolato aluminum complex ($Alq_3$) film having a thickness of 70 nm is provided as the light emitting layer and a copper phthalocyanine (CuPc) film having a thickness of 20 nm is provided thereon as the light emitting layer is used. A light emission color can be controlled by adding fluorescent pigment such as quinacridon, perylene, or DCM1 to $Alq_3$.

Note that only one pixel is shown in FIG. 5D. However, a structure in which the EL layer 5113 corresponding to respective colors of, plural colors, for example, R (red), G (green), and B (blue) are separately formed can be used.

Also, as an example using the high molecular weight based organic light emitting material, the EL layer 5113 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV and a derivative of PPV are used, a light emission wavelength from red to blue can be selected. In addition, an inorganic material such as silicon carbide can be used for the electron transporting layer and the electron injection layer.

Note that the EL layer 5113 is not limited to a layer having a laminate structure in which the hole injection layer, the hole transporting layer, the light emitting layer, the electron transporting layer, the electron injection layer, and the like are distinct. In other words, the EL layer 5113 may have a laminate structure with a layer in which materials composing the hole injection layer, the hole transporting layer, the light emitting layer, the electron transporting layer, the electron injection layer, and the like are mixed.

For example, the EL layer 5113 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5114 made from a transparent conductive film is formed on the EL layer 5113. A compound of indium oxide and tin oxide (ITO), a compound of indium oxide and zinc oxide, zinc oxide, tin oxide, indium oxide, or the like can be used for the transparent conductive film. In addition, the transparent conductive film to which gallium is added may be used. The pixel electrode 5114 corresponds to the anode of the EL element.

When the pixel electrode 5114 is formed, the EL element is completed. Note that the EL element indicates a diode composed of the pixel electrode (cathode) 5111, the EL layer 5113, and the pixel electrode (anode) 5114.

It is effective that a protective film (passivation film) 5115 is provided to completely cover the EL element. A single layer of an insulating film such as a carbon film, a silicon nitride film, or a silicon oxynitride film, or a laminate layer of a combination thereof can be used as the protective film 5115.

Note that, when light emitted from the EL element is radiated from the pixel electrode 5114 side as in this example, it is necessary to use a film which transmits light as a protective film 5115.

Note that it is effective that steps up to the formation of the protective film 5115 after the formation of the banks 5112 are conducted in succession using a multi-chamber type (or in-line type) film formation apparatus without being exposed to air.

Note that, actually, when it is completed up to the state shown in FIG. 5D, in order not to be exposed to air, it is preferable that packaging (sealing) is conducted using a protective film (laminate film, ultraviolet curable resin film, or the like) or a sealing member which has a high airtight property and low degassing. At the same time, when an inner portion surrounded by the sealing member is made to an inert atmosphere or a hygroscopic material (for example, barium oxide) is located in the inner portion, the reliability of the EL element is improved.

Also, after an airtightness level is improved by processing such as packaging, a connector (flexible printed circuit: FPC) for connecting terminals led from elements or circuits which are formed over the substrate 5000 with external signal terminals is attached so that it is completed as a product.

Additionally, the TFT manufactured in this example can be a structure of bottom gate or dual gate having two gate electrodes arranged in the up and down of channel region through an insulating film therebetween.

EXAMPLE 8

Figure 16:
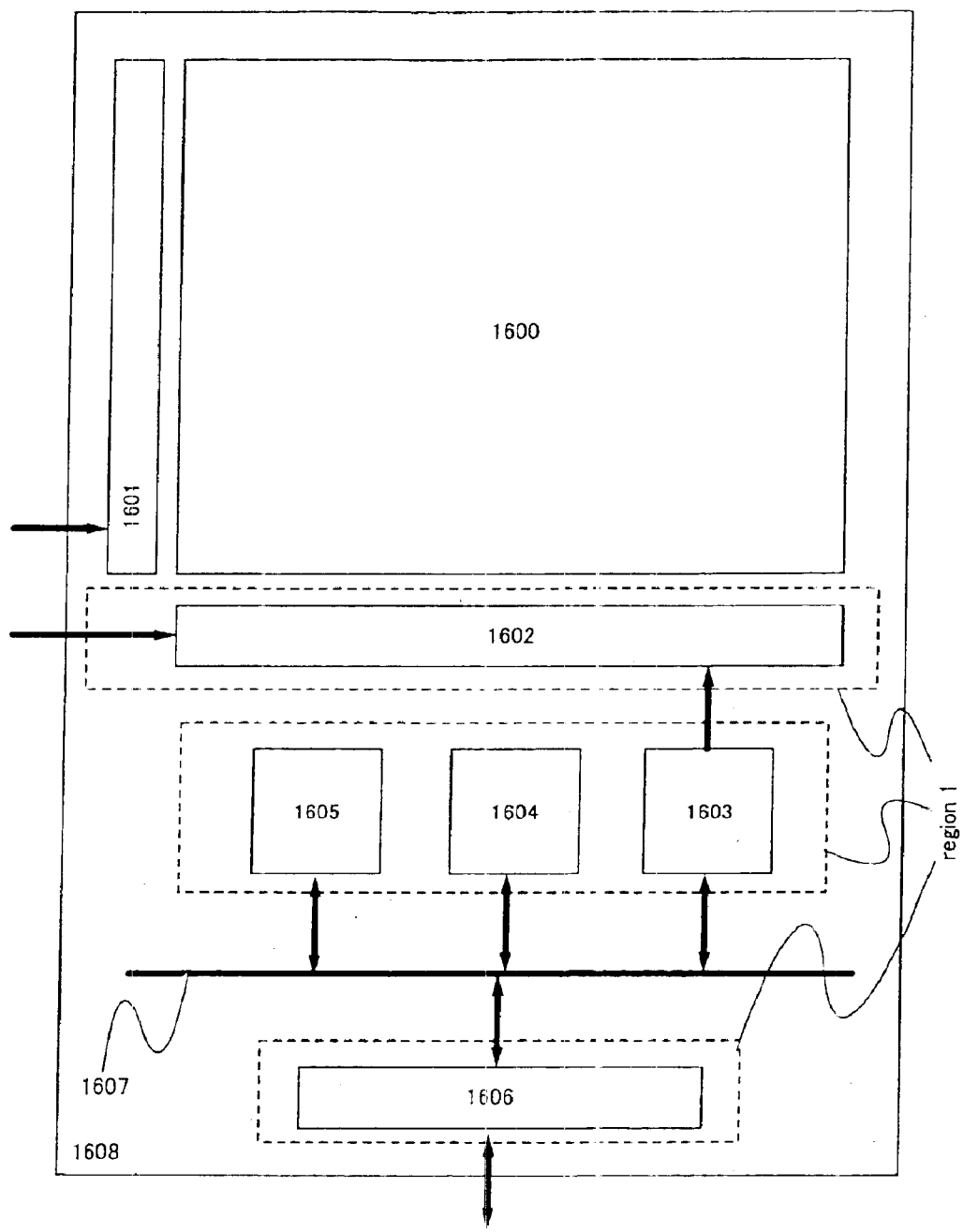
FIG. 16 is a block diagram illustrating the semiconductor device of this invention.

One example of a semiconductor device of the invention is described in this Example with reference to FIG. 16.

In FIG. 16, the semiconductor device is constituted by a pixel region 1600, a scanning line drive circuit 1601, a signal line drive circuit 1602, a VRAM 1603, a CPU 1604, a memory 1605 and an interface circuit 1606, which are formed integrally over a substrate having an insulating surface.

Described below is the operation of the semiconductor device shown in FIG. 16. The image data and the control signal of an external unit are communicated between the CPU 1604 and the external unit through the interface circuit 1606 and a system bus 1607. A keyboard, a ROM and the like can be exemplified as external units. The CPU 1604 temporarily stores the image data being processed and the control signal of the logic circuit in the memory 1605, and the processed image data are stored in the VRAM 1603. The image data stored in the VRAM 1603 are displayed on the pixel region 1600 due to the signal line drive circuit 1602 and scanning line drive circuit 1601.

The VRAM is a memory for storing the image data, and is constituted by a volatile memory such as SRAM or DRAM. A volatile memory such as SRAM or DRAM is also used as the memory 1605. The interface circuit works to temporarily store the signals input from the external unit, to convert the signals into a format that can be used in the circuit, and executes other control operations.

In this Example, the circuit blocks included in the region 1 must be operated at a particularly high speed. As described in Examples 3 to 6, therefore, there is applied a process for fabricating high-mobility TFTs by using a step of crystallizing the semiconductor film with the continuous wave laser.

By applying the process for fabricating high-mobility TFTs to the region 1, the circuit blocks included in the region 1 operate at a high speed.

When the SRAM is used as the memory, a reading cycle of 200 μsec is realized and when the DRAM is used as the memory, a reading cycle of shorter than 1 μsec is realized.

Further, the CPU having an operation frequency of not lower than 5 MHz is realized.

In this Example, the process for fabricating high-mobility TFTs was applied to the region 1. The invention, however, is not limited thereto. The person who conducts the process may apply the process for fabricating high-mobility TFTs to any region depending upon the use of the semiconductor device.

In this case, it is desired that the areas to which the process for fabricating high-mobility TFTs is applied are not larger than 50% (preferably not larger than 30%) of the whole areas of the substrate 1608. It is further desired that the regions 1 exist in a number as small as possible (preferably not larger than 10) and have a rectangular shape.

This Example can be used in combination with Examples 1 to 7.

EXAMPLE 9

Figure 17:
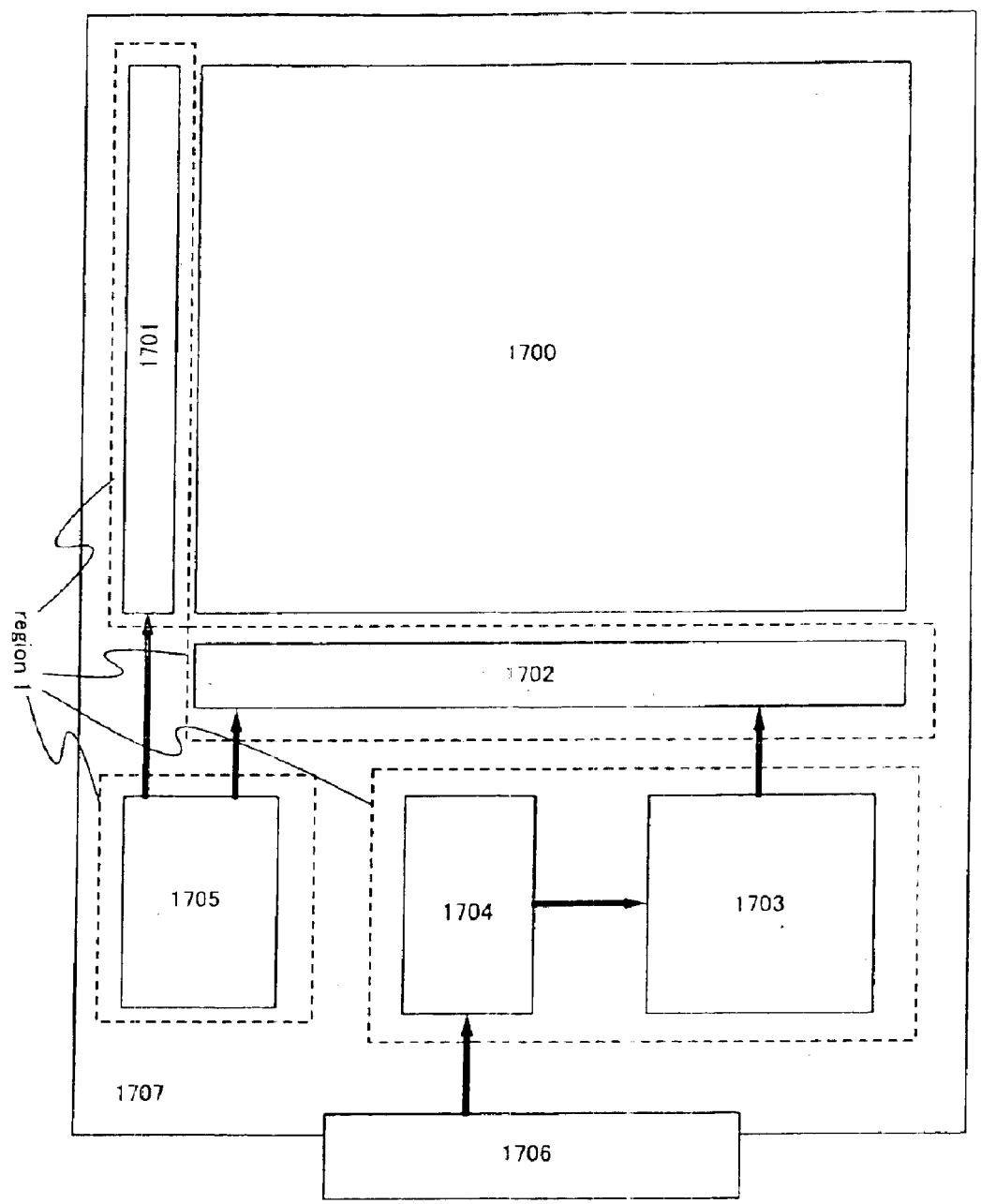
FIG. 17 is a block diagram illustrating the semiconductor device of this invention.

One example of a semiconductor device of the invention is described in this Example with reference to FIG. 17.

In FIG. 17, the semiconductor device is constituted by a pixel region 1700, a scanning line drive circuit 1701, a signal line drive circuit 1702, a frame memory 1703, a timing-forming circuit 1705 and a formal conversion unit 1704, which are formed integrally over a substrate having an insulating surface.

The constitution of this Example will now be described.

The timing-forming circuit 1705 forms clock signals for determining operation timings of the scanning line drive circuit 1701 and the signal line drive circuit 1702. The format conversion unit 1704 expands and decodes compressed and encoded signals inputted from the external unit through the FPC 1706 and conducts the image processing such as interpolation and resizing. The image data subjected to the format conversion are stored in the frame memory 1703. The image data stored in the frame memory 1703 are displayed on the pixel region 1700 due to the scanning line drive circuit 1701 and the signal line drive circuit 1702.

In this embodiment, the circuit blocks included in the regions 1 must operate at high speeds. Therefore, there is applied the process for fabricating high-mobility TFTs using the step of crystallizing the semiconductor film based on the continuously wave laser as described in Examples 3 to 6.

When the SRAM is used as the frame memory, a reading cycle of 200 nsec is realized and when the DRAM is used as the memory, a reading cycle of shorter than 1 μsec is realized.

In this Example, the drive frequency of the logic circuit included in the region 1 is not lower than 5 MHz.

In this Example, the process for fabricating high-mobility TFTs was applied to the regions 1. The invention, however, is not limited thereto. The person who conducts the process may apply the process for fabricating high-mobility TFTs to any region depending upon the use of the semiconductor device.

In this case, it is desired that the areas to which the process for fabricating high-mobility TFTs is applied are not larger than 50% (preferably not larger than 30%) of the whole areas of the substrate 1608. It is further desired that the regions 2 exist in a number as small as possible (preferably not larger than 10) and have a rectangular shape.

This Example can be used in combination with Examples 1 to 7.

EXAMPLE 10

Figure 18:
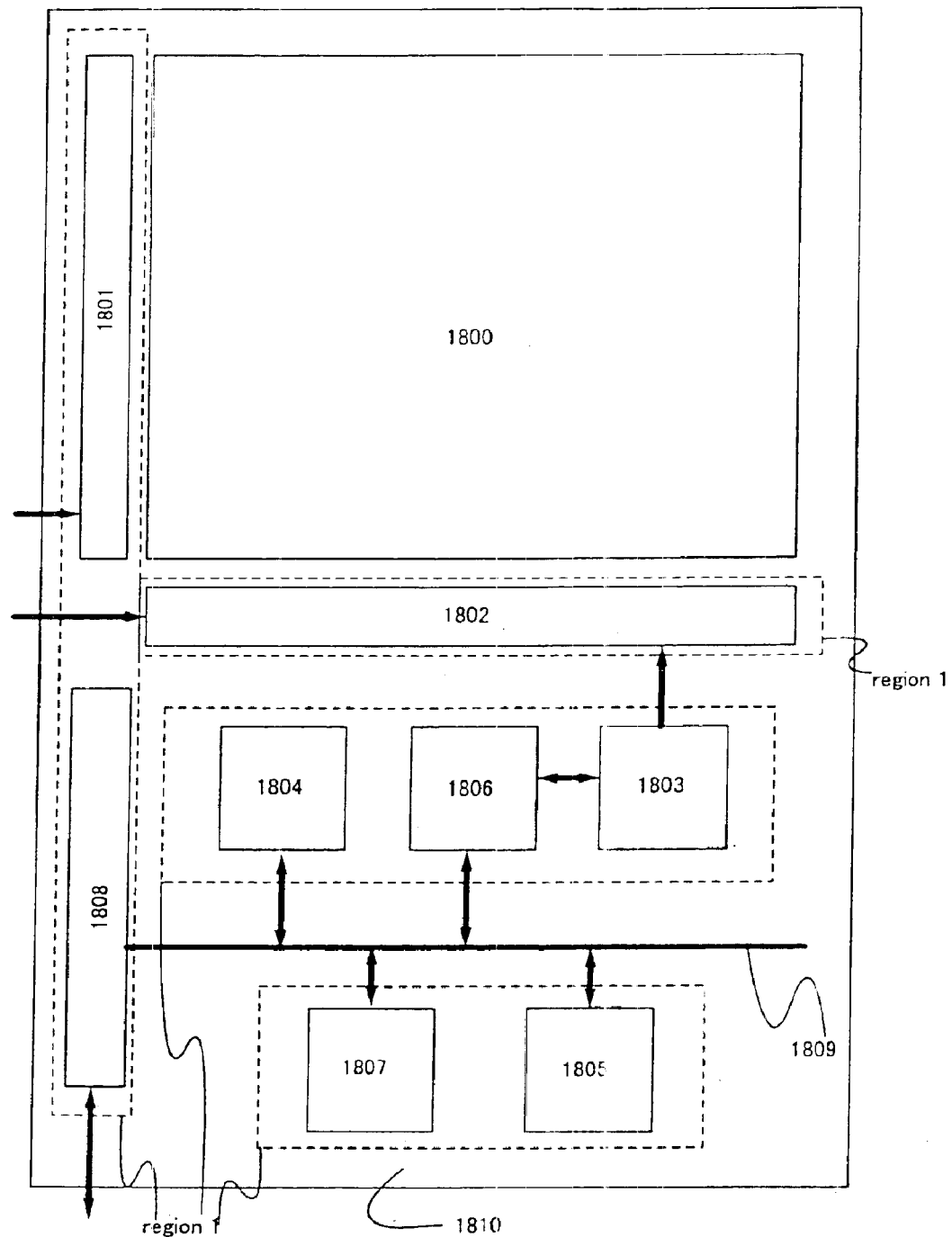
FIG. 18 is a block diagram illustrating the semiconductor device of this invention.

One Example of a semiconductor device of the invention is described in this Example with reference to FIG. 18.

In FIG. 18, the semiconductor device is constituted by a pixel region 1800, a scanning line drive circuit 1801, a signal line drive circuit 1802, a VRAM 1803, a mask ROM 1804, an arithmetic processing circuit 1805, an image processing circuit 1806, a memory 1807 and an interface circuit 1808, which are formed integrally over a substrate having an insulating surface.

The constitution of this Example will now be described.

Control signals are communicated with the external unit through the interface circuit 1808 and the system bus 1809. A keyboard or the like can be exemplified as the external unit. Program data and image data are started in the mask ROM 1804. The data stored in the mask ROM are processed while being read and written to and from the memory 1807 at all times by the arithmetic processing circuit 1805. The image data are processed such as resized through the image processing circuit 1806 and are stored in the VRAM 1803. The data stored in the VRAM 1803 are displayed on the pixel region 1800 due to the scanning line drive circuit 1801 and the signal line drive circuit 1802.

SRAM and DRAM are used as the memories and VRAMs.

In this embodiment, the image processing circuit operates at a frequency of not lower than 5 MHz. Further, the CPU operates at a frequency of not lower than 5 MHz.

In this Example, the circuit blocks included in the regions 1 must be operated at a particularly high speed. As described in Examples 3 to 6, therefore, there is applied a process for fabricating high-mobility TFTs by using a step of crystallizing the semiconductor film with the continuous wave laser.

In this Example, the process for fabricating high-mobility TFTs was applied to the regions 1. The invention, however, is not limited thereto. The person who conducts the process may apply the process for fabricating high-mobility TFTs to any region depending upon the use of the semiconductor device.

In this case, it is desired that the areas to which the process for fabricating high-mobility TFTs is applied are not larger than 50% (preferably not larger than 30%) of the whole areas of the substrate 1608. It is further desired that the regions 2 exist in a number as small as possible (preferably not larger than 10) and have a rectangular shape.

This Example can be used in combination with Examples 1 to 7.

EXAMPLE 11

Examples of electronic devices to which the present invention is applied include a video camera, a digital camera, a goggle type display (head-mounted display), a navigation system, a sound reproducing system (car audio system, audio component stereo, or the like), a notebook personal computer, a game player, a portable information terminal (mobile computer, portable telephone, portable game player, electronic book, or the like), and an image reproducing system provided with a recording medium (specifically, device which plays a recording medium such as a digital versatile disc (DVD) and is provided with a display for displaying images). Specific examples of the electronic devices are shown in FIGS. 19A to 19G.

Figure 19A:
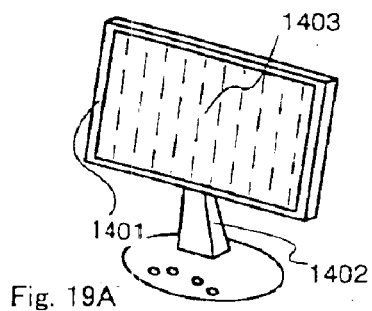
FIGS. 19A–19G are views illustrating electronic devices using the semiconductor display unit of the invention.

FIG. 19A shows a display device, which includes a casing 1401, a support stand 1402, and a display portion 1403. The present invention can be applied to the display portion 1403.

Figure 19B:
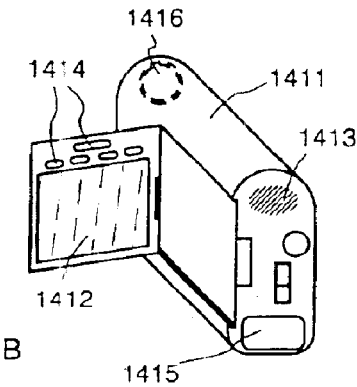

FIG. 19B shows a video camera, which is constituted by a main body 1411, a display portion 1412, a sound input portion 1413, operation switches 1414, a battery 1415, an image receiving portion 1416, and the like. The present invention can be applied to the display portion 1412.

Figure 19C:
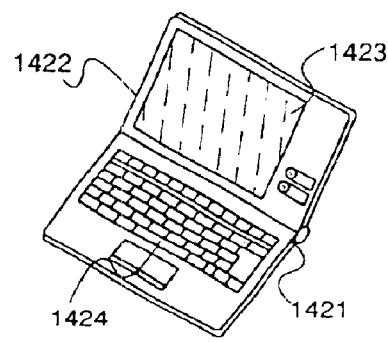

FIG. 19C shows a notebook personal computer, which is constituted by a main body 1421, a casing 1422, a display portion 1423, a keyboard 1424, and the like. The present invention can be applied to the display portion 1423.

Figure 19D:
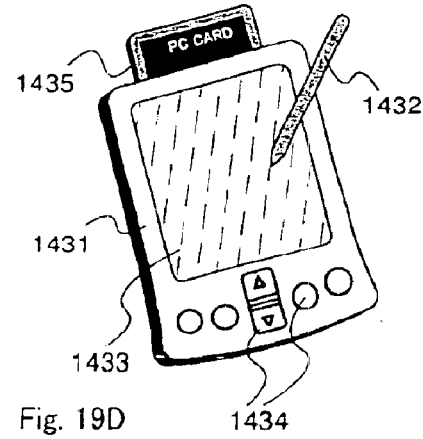

FIG. 19D shows a portable information terminal, which is constituted by a main body 1431, a stylus 1432, a display portion 1433, operation buttons 1434, an external interface 1435, and the like. The present invention can be applied to the display portion 1433.

Figure 19E:
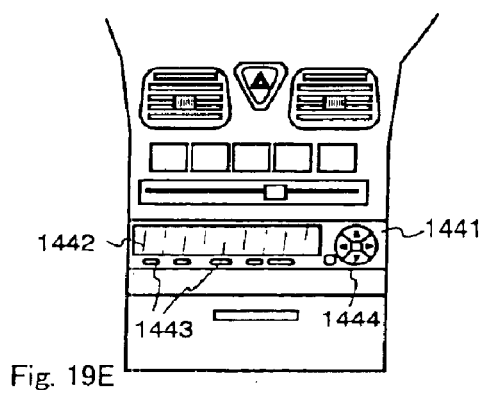

FIG. 19E shows a sound reproducing system, specifically, an audio system for an automobile, which is constituted by a main body 1441, a display portion 1442, operation switches 1443 and 1444, and the like. The present invention can be applied to the display portion 1442. Further, the audio system for an automobile is taken as an example here, but a portable or domestic audio system may be given.

Figure 19F:
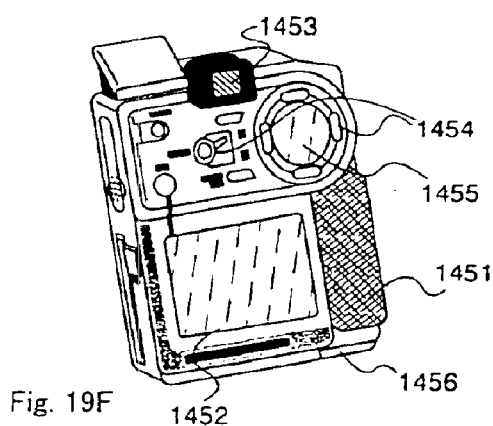

FIG. 19F shows a digital camera, which is constituted by a main body 1451, a display portion A 1452, an eyepiece portion 1453, operation switches 1454, a display portion B 1455, a battery 1456, and the like. The present invention can be applied to the display portion A 1452 and the display portion B 1455.

Figure 19G:
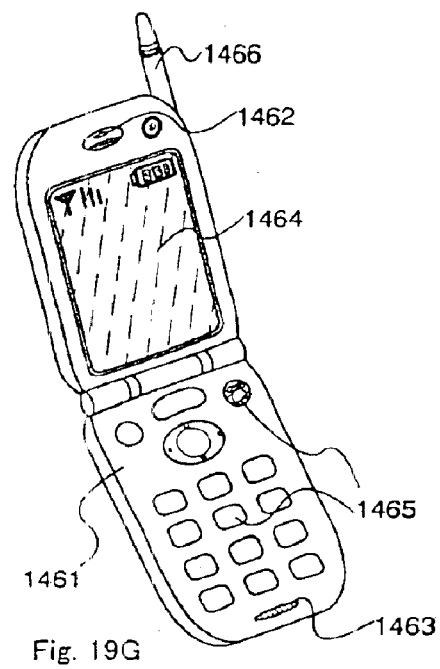

FIG. 19G shows a portable telephone, which is constituted by a main body 1461, a sound output portion 1462, a sound input portion 1463, a display portion 1464, operation switches 1465, an antenna 1466, and the like. The present invention can be applied to the display portion 1464.

Not only a glass substrate but also a heat-resistance plastic substrate can be used for the display device used in each of the above electronic devices. Thus, reduction in weight of the electronic device can be attained.

Note that examples shown in Example 11 are no more than some application examples. It should be mentioned that the present invention is not limited to these uses.

Example 11 can be performed by freely combining with Embodiments and Examples 1 to 7.

In this invention, the semiconductor display unit and other circuit blocks are integrally formed over the substrate having an insulating surface by employing the process for fabricating TFTs that realize a high degree of mobility. As the process for fabricating TFTs for realizing a high degree of mobility, there is employed a step of crystallizing the semiconductor active layer by employing the continuous wave laser.

Accordingly, there are provided a small semiconductor device having a display unit featuring improved reliability by mounting IC chips over the substrate, and a semiconductor device realizing a high operation frequency as a result of decreasing the wiring capacity by integrally forming the IC chips and as a result of improving circuit characteristics.

According to this invention, further, the process for crystallization based on the continuous wave laser is selectively effected for only circuit blocks that must be operated at high speeds. This makes it possible to greatly improve the throughput in the step of crystallization without decreasing the operation speed of the semiconductor device. Owing to a great reduction in the areas of the substrate for mounting the IC chips and owing to a high throughput, further, there is provided a semiconductor device having a display unit at a low cost.

What is claimed is:

1. A method for manufacturing a semiconductor device comprising:
    forming a scanning line drive circuit and a signal line drive circuit over a substrate, wherein at least one of the scanning line drive circuit or the signal line drive circuit comprises a first thin film transistor;
    forming a pixel region comprising a second thin film transistor over the substrate,
    a method of forming the first thin film transistor comprising:
    forming a first crystalline semiconductor film by irradiating a semiconductor film with a beam in a direction of channel length of the first thin film transistor,
    a method of forming the second thin film transistor comprising:
    forming a second crystalline semiconductor film by heat treatment.

2. A method for manufacturing a semiconductor device comprising:
    forming a scanning line drive circuit and a signal line drive circuit over a substrate, wherein at least one of the scanning line drive circuit or the signal line drive circuit comprises a first thin film transistor;
    forming a pixel region comprising a second thin film transistor over the substrate,
    a method of forming the first thin film transistor comprising:
    forming a first crystalline semiconductor film by irradiating a semiconductor film with a beam in a direction of channel length of the first thin film transistor,
    a method of forming the second thin film transistor comprising:
    adding a metal element to a second semiconductor film; and
    forming a second crystalline semiconductor film by heat treatment,
    crystallizing the second semiconductor film by heating.

3. A method according to claim 1, wherein the energy beam is a continuous wave laser light.

4. A method according to claim 2, wherein the energy beam is a continuous wave laser light.

5. A method according to claim 1, wherein the drive frequency of the scanning line drive circuit is from 1 kHz to 1 MHz, and the drive frequency of the signal line drive circuit is from 100 kHz to 100 MHz.

6. A method according to claim 2, wherein the drive frequency of the scanning line drive circuit is from 1 kHz to 1 MHz, and the drive frequency of the signal line drive circuit is from 100 kHz to 100 MHz.

7. A method according to claim 1, wherein a memory is provided on the same substrate, the memory comprises the first thin film transistor.

8. A method according to claim 2, wherein a memory is provided on the same substrate, the memory comprises the first thin film transistor.

9. A method according to claim 7, wherein the memory is an SRAM having a read cycle time of not longer than 200 nsec.

10. A method according to claim 8, wherein the memory is an SRAM having a read cycle time of not longer than 200 nsec.

11. A method according to claim 7, wherein the memory is a DRAM having a read cycle time of not longer than 1 μsec.

12. A method according to claim 8, wherein the memory is a DRAM having a read cycle time of not longer than 1 μsec.

13. A method according to claim 1, wherein a CPU is provided on the same substrate, and the CPU comprises the first thin film transistor.

14. A semiconductor device according to claim 2, wherein a CPU is provided on the same substrate, and the CPU comprises the first thin film transistor.

15. A method according to claim 13, wherein the operation frequency of the CPU is not lower than 5 MHz.

16. A method according to claim 14, wherein the operation frequency of the CPU is not lower than 5 MHz.

17. A method according to claim 1, wherein an image processing circuit is provided on the same substrate, and the image processing circuit comprises the first thin film transistor.

18. A method according to claim 2, wherein an image processing circuit is provided on the same substrate, and the image processing circuit comprises the first thin film transistor.

19. A method according to claim 17, wherein the operation frequency of the image processing circuit is not lower than 5 MHz.

20. A method according to claim 18, wherein the operation frequency of the image processing circuit is not lower than 5 MHz.

21. A method according to claim 1, wherein a DSP is provided on the same substrate, and the DSP comprises the first thin film transistor.

22. A method according to claim 2, wherein a DSP is provided on the same substrate, and the DSP comprises the first thin film transistor.

23. A method according to claim 21, wherein the operation frequency of the DSP is not lower than 5 MHz.

24. A method according to claim 22, wherein the operation frequency of the DSP is not lower than 5 MHz.

25. A method according to claim 1, wherein a timing generating circuit is provided on the same substrate, and the timing generating circuit comprises the first thin film transistor.

26. A method according to claim 2, wherein a timing generating circuit is provided on the same substrate, and the timing generating circuit comprises the first thin film transistor.

27. A method according to claim 1, wherein the substrate is any one of a plastic substrate, a glass substrate or a quartz substrate.

28. A method according to claim 2, wherein the substrate is any one of a plastic substrate, a glass substrate or a quartz substrate.

29. A method according to claim 1, wherein the area of the circuits comprising the first thin film transistor is not larger than 50% of the area of the substrate.

30. A method according to claim 2, wherein the area of the circuits comprising the first thin film transistor is not larger than 50% of the area of the substrate.

31. A method according to claim 1, wherein the semiconductor device is a liquid crystal display device.

32. A method according to claim 1, wherein the semiconductor device is a liquid crystal display device.

33. A method according to claim 1, wherein the semiconductor device is a light-emitting device.

34. A method according to claim 2, wherein the semiconductor device is a light-emitting device.

35. A method according to claim 1, wherein the semiconductor device is incorporated into an electronic device selected from the group consisting of a game device, a video camera, a head-mounted type display, a DVD player, a personal computer, cell phone and a car audio device.

36. A method according to claim 2, wherein the semiconductor device is incorporated into an electronic device selected from the group consisting of a game device, a video camera, a head-mounted type display, a DVD player, a personal computer, a cell phone and a car audio device.

37. A method for manufacturing a semiconductor device comprising:
forming a first crystalline semiconductor film by irradiating a semiconductor film with a continuous wave laser beam, over a substrate;
forming a first thin film transistor comprising the first crystalline semiconductor film;
forming a second crystalline semiconductor film by heat treatment by using a pulse laser, an RTA, a furnace annealing, or a metal element that promotes crystallization, over a substrate;
forming a second thin film transistor comprising the second crystalline semiconductor film,
wherein the continuous wave laser beam is scanned in a direction of channel length of the first thin film transistor,
wherein at least one of a scanning line drive circuit and a signal line drive circuit comprises the first thin film transistor, and
wherein a pixel region comprises the second thin film transistor.

38. A method according to claim 37, wherein the drive frequency of the scanning line drive circuit is from 1 kHz to 1 MHz, and the drive frequency of the signal line drive circuit is from 100 kHz to 100 MHz.

39. A method according to claim 37, wherein the substrate is any one of a plastic substrate, a glass substrate or a quartz substrate.

40. A method according to claim 37, wherein an area of circuits comprising the second thin film transistor is not larger than 50% of the area of the substrate.

41. A method according to claim 37, wherein the semiconductor device is a liquid crystal display device.

42. A method according to claim 37, wherein the semiconductor device is a light-emitting device.

43. A method according to claim 37, wherein the semiconductor device is incorporated into an electronic device selected from the group consisting of a game device, a video camera, a head-mounted type display, a DVD player, a personal computer, a cell phone and a car audio device.

44. A method for manufacturing a semiconductor device comprising:
forming a first crystalline semiconductor film by irradiating a semiconductor film with a continuous wave laser beam, over a substrate;
forming a first thin film transistor comprising the first crystalline semiconductor film;
forming a second crystalline semiconductor film by heat treatment using a pulse laser, an RTA, a furnace annealing, or a metal element hat promotes crystalline, over the substrate;
forming a second thin film transistor comprising the second crystalline semiconductor film,
wherein the continuous wave laser beam is scanned in a direction of channel length of the first thin film transistor,
wherein the first thin film transistor is included in at least one circuit selected from the group consisting of a memory, a CPU, an image processing circuit, a DSP, and a timing generating circuit, and
wherein a pixel region comprises the second thin film transistor.

45. A method according to claim 44, wherein the memory is an SRAM having a read cycle time of not longer than 200 nsec.

46. A method according to claim 44, wherein the memory is a DRAM having a read cycle time of not longer than 1 µsec.

47. A method according to claim 44, wherein the drive frequency of the scanning line drive circuit is from 1 kHz to 1 MHz, and the drive frequency of the signal line drive circuit is from 100 kHz to 100 MHz.

48. a method according to claim 44, wherein the operation frequency of the CPU is not lower than 5 MHz.

49. A method according to claim 44, wherein the operation frequency of the image processing circuit is not lower than 5 MHz.

50. A method according to claim 44, wherein the operation frequency of the DSP is not lower than 5 MHz.

51. A method according to claim 44, wherein the substrate is any one of a plastic substrate, a glass substrate, or a quartz substrate.

52. A method according to claim 44, wherein an area of circuits comprising the second thin film transistor is not larger than 50% of the area of the substrate.

53. A method according to claim 44, wherein the semiconductor device is a liquid crystal display device.

54. A method according to claim 44, wherein the semiconductor device is a light-emitting device.

55. A method according to claim 44, wherein the semiconductor device is incorporated into an electronic device selected from the group consisting of a game device, a video camera, a head-mounted type display, a DVD player, a personal computer, a cell phone and a car audio device.

56. A method for manufacturing a semiconductor device comprising:

forming a first crystalline semiconductor film by irradiating a semiconductor film with a continuous wave laser beam, over a substrate;

forming a first thin film transistor comprising the first crystalline semiconductor film;

forming a second crystalline semiconductor film by heat treatment using a pulse laser, an RTA, a furnace annealing, or a metal element that promotes crystallization, over the substrate;

forming second and third film transistors each of which comprising the second crystalline semiconductor film, wherein the continuous wave laser beam is scanned in a direction of channel length of the first thin film transistor, wherein the first film transistor is included in at least one circuit selected from the group consisting of a memory, a CPU, an image processing circuit, a DSP, and a timing generating circuit, wherein a pixel region comprises the second thin film transistor, and wherein at least one of a scanning line drive circuit and a signal line drive circuit comprises the third thin film transistor.

57. A method according to claim 56, wherein the memory is an SRAM having a read cycle time of not longer than 200 nsec.

58. A method according to claim 56, wherein the memory is a DRAM having a read cycle time of not longer than 1 μsec.

59. A method according to claims 56, wherein the drive frequency of the scanning line drive circuit is from 1 kHz to 1 MHz, and the drive frequency of the signal line drive circuit is from 100 kHz to 100 MHz.

60. A method according to claim 56, wherein the operation frequency of the CPU is not lower than 5 MHz.

61. A method according to claim 56, wherein the operatin frequency of the image processing circuit is not not lower than 5 MHz.

62. A method according to claim 56, wherein the operation frequency of the DSP is not lower than 5 MHZ.

63. A method according to claim 56, wherein the substrate is any one of a plastic substrate, a glass substrate or a quartz substrate.

64. A method according to claim 56, wherein an area of circuits comprising the second thin film transistor is not larger than 50% of the area of the substrate.

65. A method according to claim 56, wherein the semiconductor device is a liquid crystal display device.

66. A method according to claim 56, wherein the semiconductor device is a light-emitting device.

67. A method according to claim 56, wherein the semiconductor device is incorporated into an electronic device selected from the group consisting of a game device, a video camera, a head-mounted type display, a DVD player, a personal computer, a cell phone and a car audio device.

* * * * *